United States Patent
Zhu et al.

(10) Patent No.: US 8,227,316 B2
(45) Date of Patent: Jul. 24, 2012

(54) METHOD FOR MANUFACTURING DOUBLE GATE FINFET WITH ASYMMETRIC HALO

(75) Inventors: Huilong Zhu, Poughkeepsie, NY (US); Oleg Gluschenkov, Poughkeepsie, NY (US); Jing Wang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 1395 days.

(21) Appl. No.: 11/427,409

(22) Filed: Jun. 29, 2006

(65) Prior Publication Data
US 2008/0001227 A1 Jan. 3, 2008

(51) Int. Cl.
*H01L 21/336* (2006.01)

(52) U.S. Cl. ............ 438/286; 257/618; 257/E21.618; 257/E21.633; 438/157; 438/283; 438/525

(58) Field of Classification Search .......... 257/618, 257/E21.618, E21.633; 438/157, 283, 286, 438/525
See application file for complete search history.

(56) References Cited

U.S. PATENT DOCUMENTS

| | | |
|---|---|---|
| 6,972,461 B1 | 12/2005 | Chen et al. |
| 6,977,194 B2 | 12/2005 | Belyansky et al. |
| 2002/0192911 A1* | 12/2002 | Parke .................... 438/270 |
| 2003/0178677 A1* | 9/2003 | Clark et al. .................... 257/347 |
| 2004/0166611 A1* | 8/2004 | Liu ................ 438/142 |
| 2005/0001273 A1* | 1/2005 | Bryant et al. ................ 257/369 |
| 2005/0093059 A1 | 5/2005 | Belyansky et al. |
| 2005/0110085 A1 | 5/2005 | Zhu et al. |
| 2005/0130358 A1 | 6/2005 | Chidambarrao et al. |
| 2005/0145954 A1 | 7/2005 | Zhu et al. |
| 2005/0233565 A1 | 10/2005 | Zhu et al. |
| 2005/0239242 A1 | 10/2005 | Zhu et al. |
| 2005/0282325 A1 | 12/2005 | Belyansky et al. |
| 2006/0003554 A1 | 1/2006 | Zhu et al. |
| 2006/0014338 A1 | 1/2006 | Doris et al. |
| 2006/0022270 A1* | 2/2006 | Boyd et al. .................... 257/351 |
| 2006/0040450 A1* | 2/2006 | Hsu .................... 438/305 |
| 2006/0154428 A1* | 7/2006 | Dokumaci .................... 438/302 |
| 2006/0189081 A1* | 8/2006 | Hsu et al. .................... 438/268 |
| 2006/0237746 A1* | 10/2006 | Orlowski et al. ............. 257/192 |
| 2008/0105897 A1* | 5/2008 | Zhu .................... 257/190 |
| 2008/0111185 A1* | 5/2008 | Cheng .................... 257/347 |

* cited by examiner

*Primary Examiner* — Tom Thomas
*Assistant Examiner* — Christopher M Roland
(74) *Attorney, Agent, or Firm* — Whitham, Curtis, Christofferson & Cook, P.C.; Joseph P. Abate

(57) ABSTRACT

A finFet controls conduction channel conditions using one of two gate structures, preferably having a gate length shorter than the other gate structure to limit capacitance, which are opposed across the conduction channel. An asymmetric halo impurity implant performed at an angle adjacent to the gate structure for controlling conduction channel conditions forms a super steep retrograde well to limit short channel effects in the portion of the conduction channel which is controlled by the other gate structure.

10 Claims, 32 Drawing Sheets

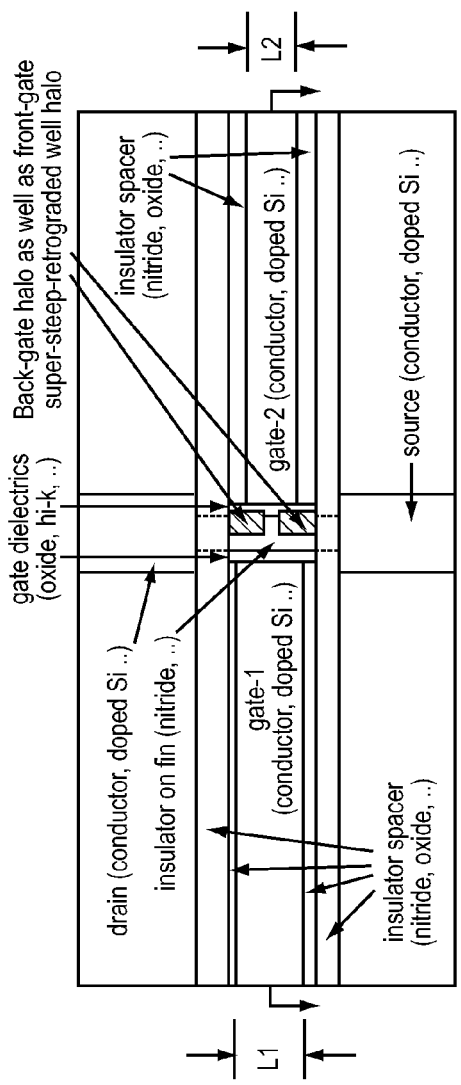
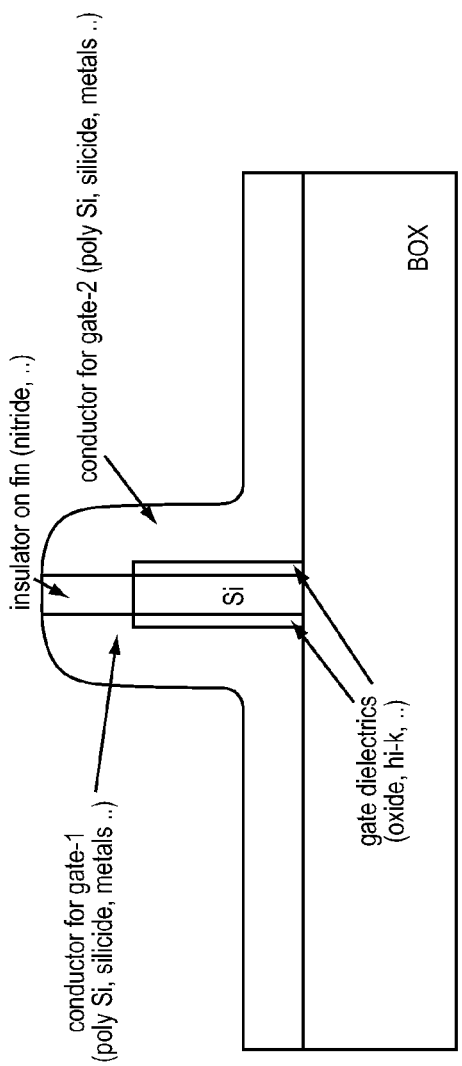
*Figure 25*
*Figure 26*

US 8,227,316 B2

METHOD FOR MANUFACTURING DOUBLE GATE FINFET WITH ASYMMETRIC HALO

BACKGROUND OF THE INVENTION

1. Field of the Invention

The present invention generally relates to field effect transistors (FETs) and, more particularly, to double gate FETs configured as finFETs.

2. Description of the Prior Art

Field effect transistors have become the device of choice for fabrication of integrated digital logic circuits operating at all but the highest of clock rates. FETs can be fabricated at extremely small sizes consistent with extremely small minimum feature size regimes. However, some electrical characteristics of FETs may be degraded as FET designs are scaled to such extremely small sizes or operating margins may be reduced due to requirements of electrical breakdown, reduced voltages for thermal management and the like. For example, switching threshold voltages may not be sufficiently uniform to allow reliable operations at current and foreseeable clock rates unless some control therefor is provided. One such control technique is to employ substrate voltage control or a second gate for the FETs in order to more closely control conduction channel conditions. Unfortunately, a second gate is difficult to provide in a common planar FET design having, for example, a conduction channel in a substrate and a gate on the surface thereof. Thus, in order to more easily provide a second gate, so-called finFET designs having the conduction channel parallel to the substrate but oriented orthogonal thereto have been proposed and fabricated in order to provide access to both sides of the conduction channel.

However, finFET designs generally have less doping than semiconductor on insulator (SOI) and bulk devices. This lower doping tends to compromise control of the switching threshold of finFETs. Further, since finFETs are double gate devices, allowing the back gate to be used to adjust the switching threshold, $V_t$, the back gate also increases capacitance which tends to degrade finFET performance. Moreover, as with SOI and bulk devices when scaled to small sizes, finFETs also exhibit short channel effects (SCE).

It is known that a so-called halo implant can be used to improve short channel effects but such structures, in a finFET, degrades carrier mobility in the channel. Similarly, a super-steep retrograded well can reduce SCE but is very difficult to form the well for planar MOSFET designs.

SUMMARY OF THE INVENTION

It is therefore an object of the present invention to provide a finFET structure having reduced capacitance and short channel effects without degrading carrier mobility in the channel and a relatively simple, economical and repeatable method for manufacturing the same with high yield.

In order to accomplish these and other objects of the invention, a finFET and an integrated circuit including a finFET are provided including a first gate, a second gate, and a halo implant asymmetrically located in a channel of the finFET proximate to the second gate and forming a super-steep retrograde well (SSRW) for a conduction channel adjacent to and controlled by the first gate.

In accordance with another aspect of the invention, a method of forming a finFET is provided comprising steps of forming a conduction channel as a fin, forming first and second gate structures on opposite sides of the fin, and performing an angled impurity implant aa a halo implant adjacent the second gate structure forming a super-steep retrograde well for the conduction channel portion controlled by the first gate.

BRIEF DESCRIPTION OF THE DRAWINGS

The foregoing and other objects, aspects and advantages will be better understood from the following detailed description of a preferred embodiment of the invention with reference to the drawings, in which:

FIGS. 25 and 26 are plan and cross-sectional views of the salient features of the completed finFET structure in accordance with the invention.

DETAILED DESCRIPTION OF A PREFERRED EMBODIMENT OF THE INVENTION

Figure 1:
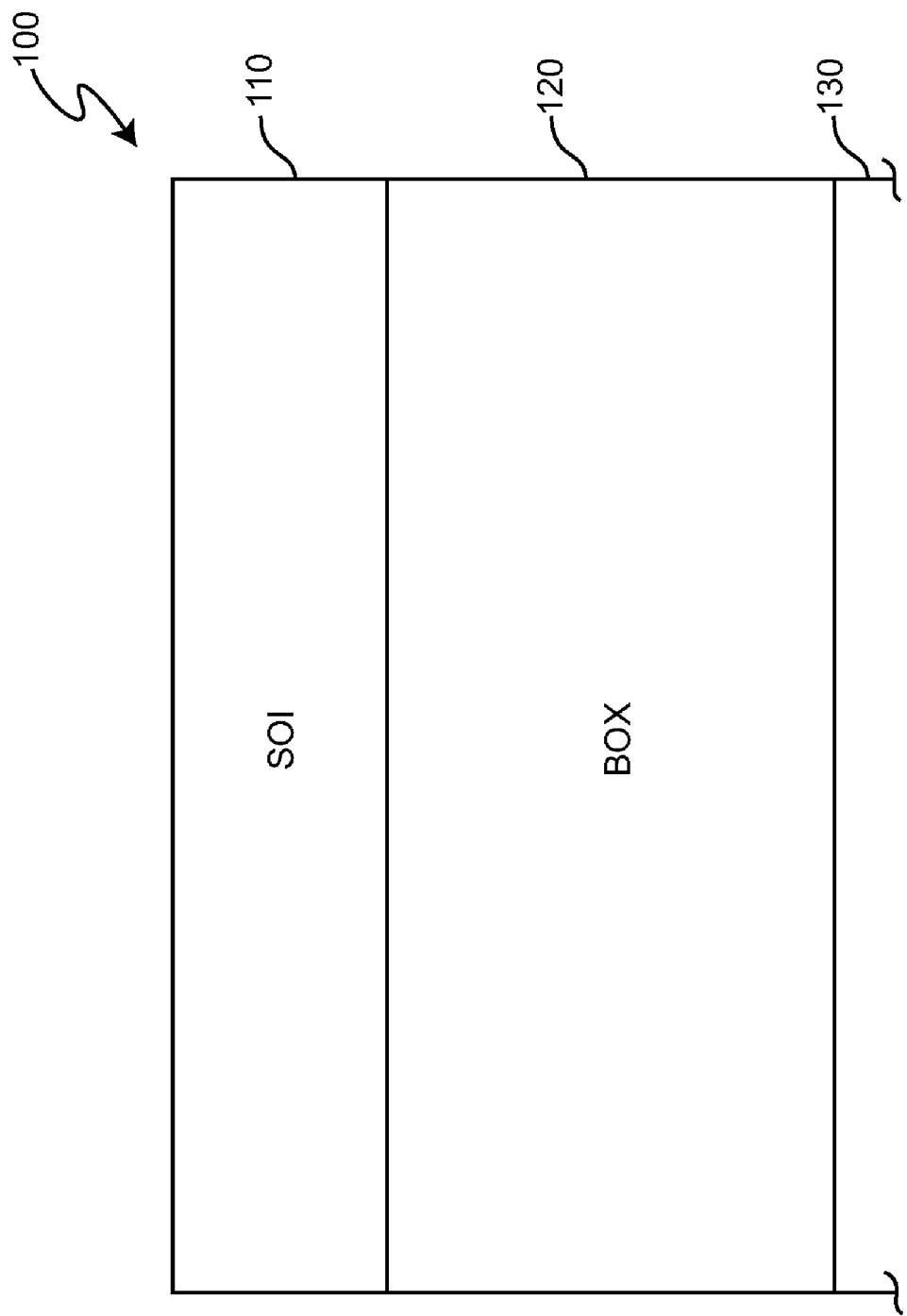
FIG. 1 is a cross-sectional view of a semiconductor-on-insulator wafer which is preferred for fabrication of the finFETs in accordance with the invention.

Referring now to the drawings, and more particularly to FIG. 1, there is shown in cross-sectional view, a portion of a semiconductor-on-insulator (SOI) wafer which is preferred for fabrication of finFETs in accordance with the invention. However, it is to be understood that the invention may be practiced using other materials and other types of wafers as will be understood by those skilled in the art in view of the following description of the invention. It should also be appreciated that the cross-sectional views of FIGS. 1-12, 16-21 and 23-26 are taken within the central region of the channel (e.g. section A-A) in such that the source and drain of the transistor are in front of in back of the plane of the page of each respective Figure. FIGS. 22 and 23 include a cross-section (e.g. section B-B) taken adjacent the conduction channel.

FIG. 1 illustrates the cross-section of an SOI wafer 100. As is known in the art, an SOI wafer is often preferred for current transistor designs due to the high quality of semiconductor material such as silicon which can be developed in semiconductor layer 110 formed on buried insulator (e.g. oxide) layer 120, often referred to as a buried oxide or "BOX". The BOX layer 120 is formed on a thicker semiconductor layer 130 which provides structural robustness and heat dissipation but has no electrical function in most integrated circuit (IC) designs including the present invention but the formation of other circuit elements thereon as may be desired is known. Handling substrate Layer 130 will be omitted in other Figures in the interest of clarity.

Figure 2:
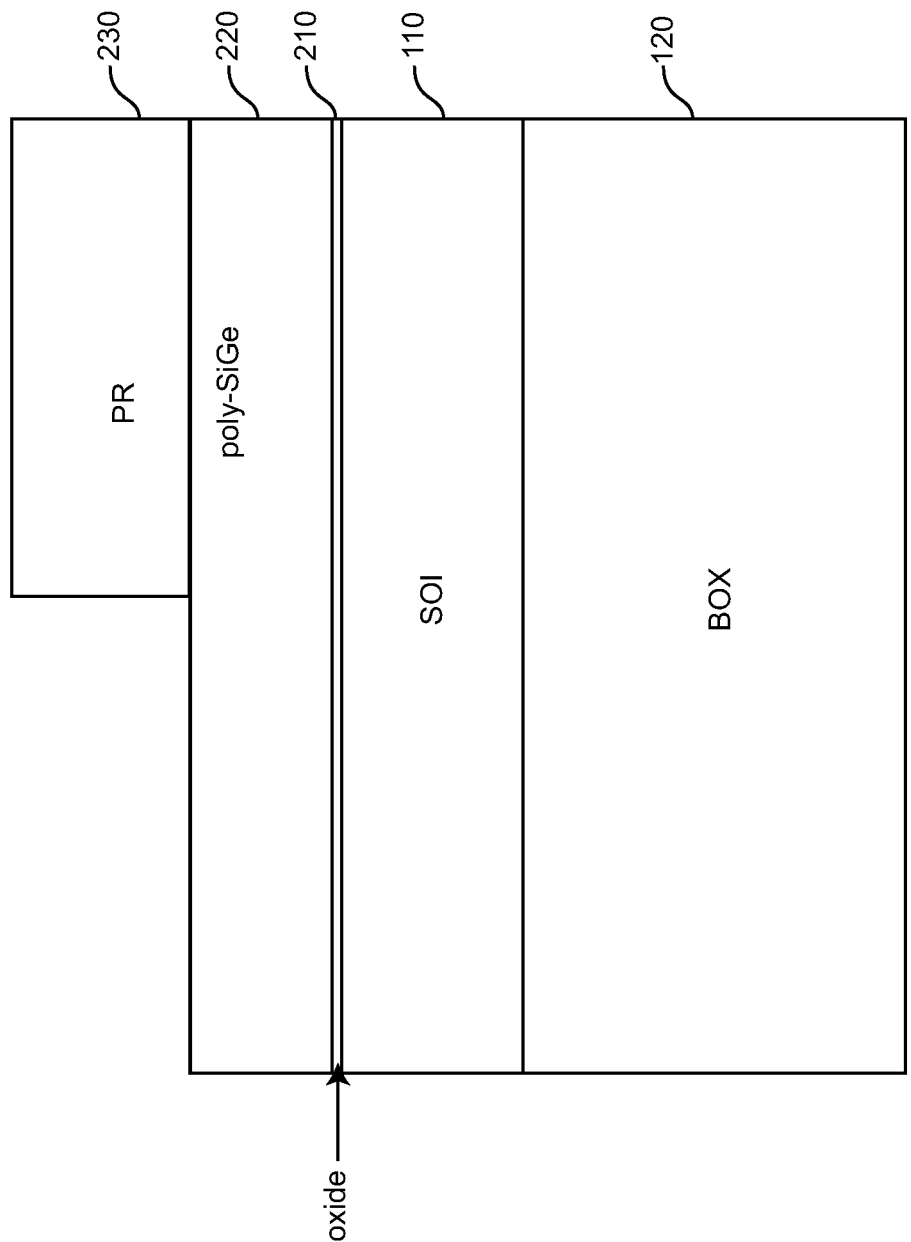
FIGS. 2, 3A, 3B, 4A, 4B, 5, 6, 7, 8, 9, 10, 11 and 12 are cross-sectional views of intermediate stages in manufacture of a finFET in accordance with a first exemplary embodiment of the invention.
Figure 3B:
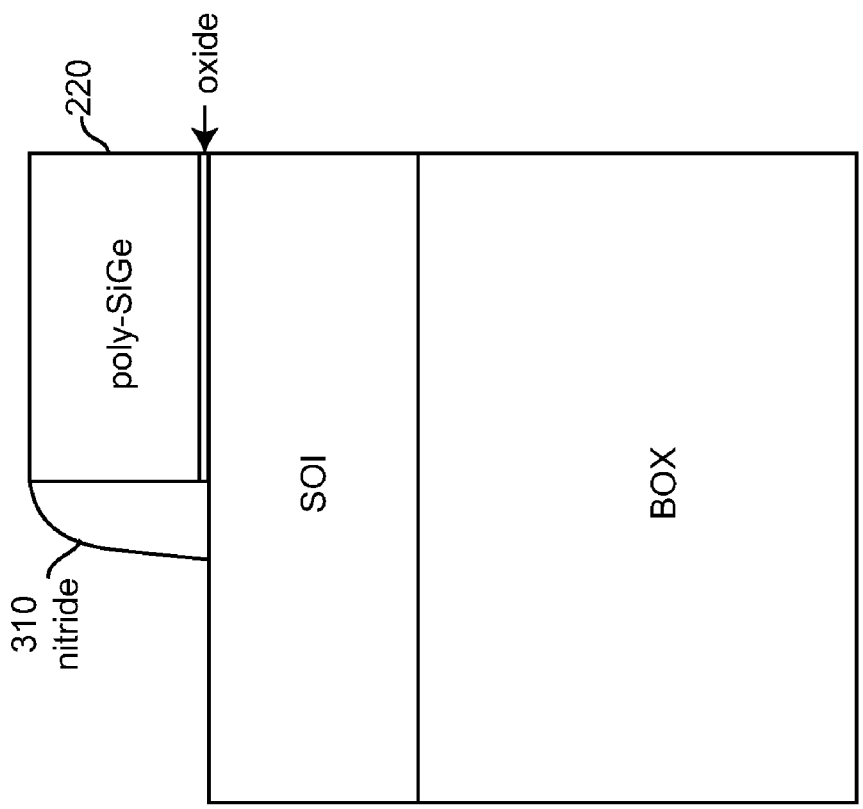
Figure 3A:
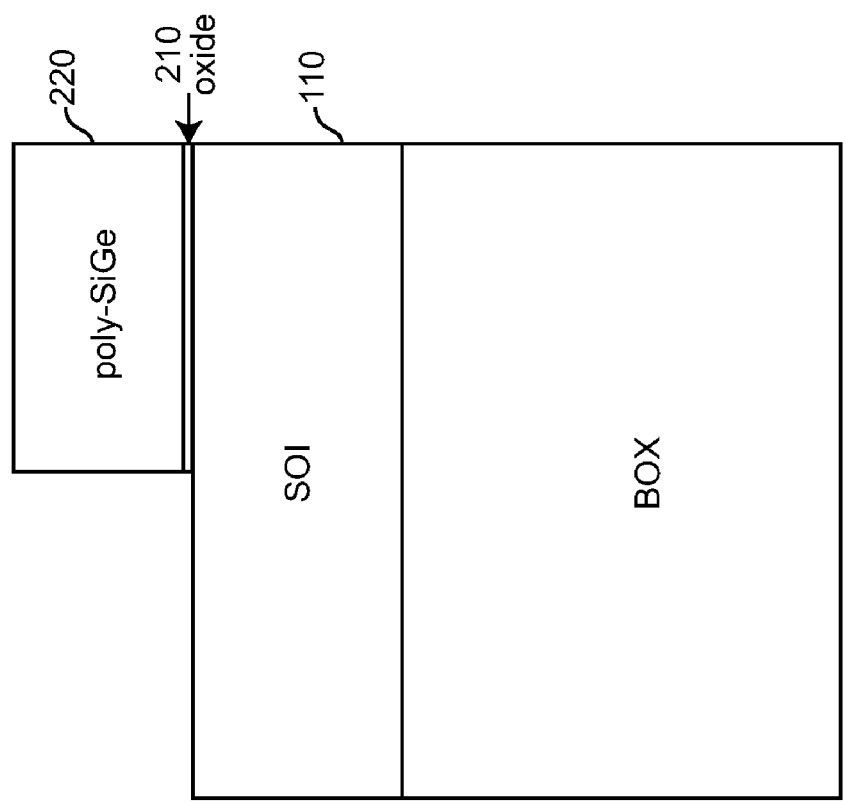
Figure 4B:
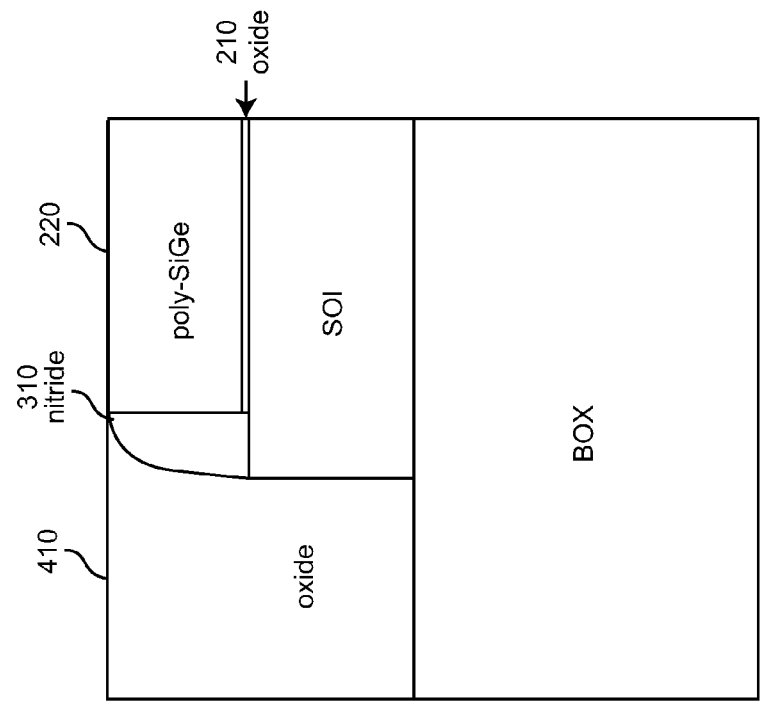
Figure 4A:
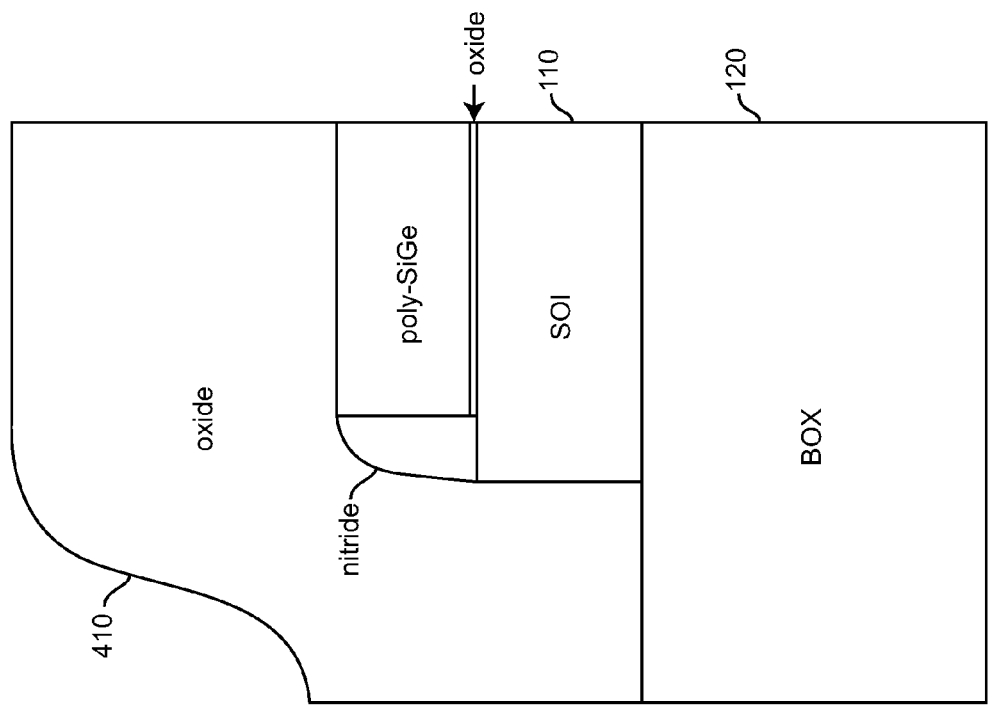

As shown in FIG. 2, the process of manufacture of a finFET in accordance with the invention begins with the formation (e.g. by deposition by chemical vapor deposition (CVD) or growth by a thermal process) of a thin (e.g. 1-10 nm) oxide layer 210, followed by deposition of a layer of polycrystalline silicon-germanium alloy (SiGe) which is preferred for ease of selective etching later in the process although other materials could be used since this material does not remain in the completed transistor. A layer of resist, preferably photoresist, PR, 230 is then applied and patterned to form an edge at the desired location of the transistor. The polycrystalline SiGe layer (poly-SiGe) 220 is then etched and the resist is removed using an $O_2$ ash or wet solvent stripping process and the thin oxide 210 is removed using a wet or dry etch process to result in the structure illustrated in FIG. 3A. A spacer 310, preferably of silicon nitride ($Si_3N_4$), is then formed on the side of the poly-SiGe layer 220 and thin oxide layer 210 as shown in FIG. 3B. This is preferably accomplished by an anisotropic deposition followed by an isotropic etch as is well-known in the art.

Figure 5:
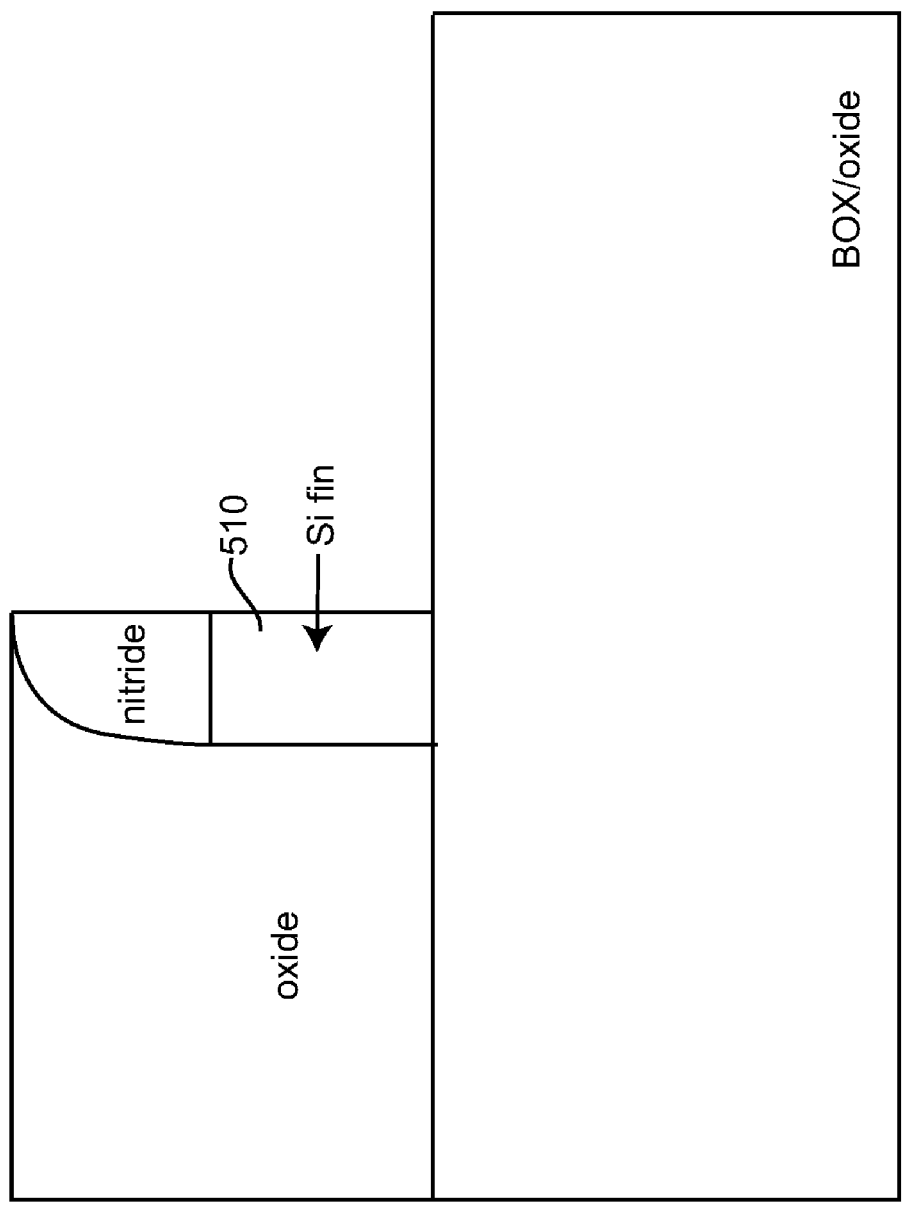

The structure of FIG. 3B is then etched through the SOI layer 110 to the BOX layer 120 using the spacer 310 and the poly-SiGe 220 as a hard mask using a selective dry etch. A thick oxide film 410 is then deposited preferably using a high density plasma (HDP) or sub-atmospheric CVD (SACVD) process to result in the structure shown in FIG. 4A. This structure is then planarized to the nitride spacer 310 and poly-SiGe 210 to result in the structure illustrated in FIG. 4B. Then, the remaining poly-SiGe 220 and thin oxide 210 are removed and the SOI layer 110 etched, preferably using a conventional dry etch, to the BOX layer 120 as shown in FIG. 5. The remaining SOI thus forms the vertical fin 510 forming the conduction channel for the transistor.

Figure 6:
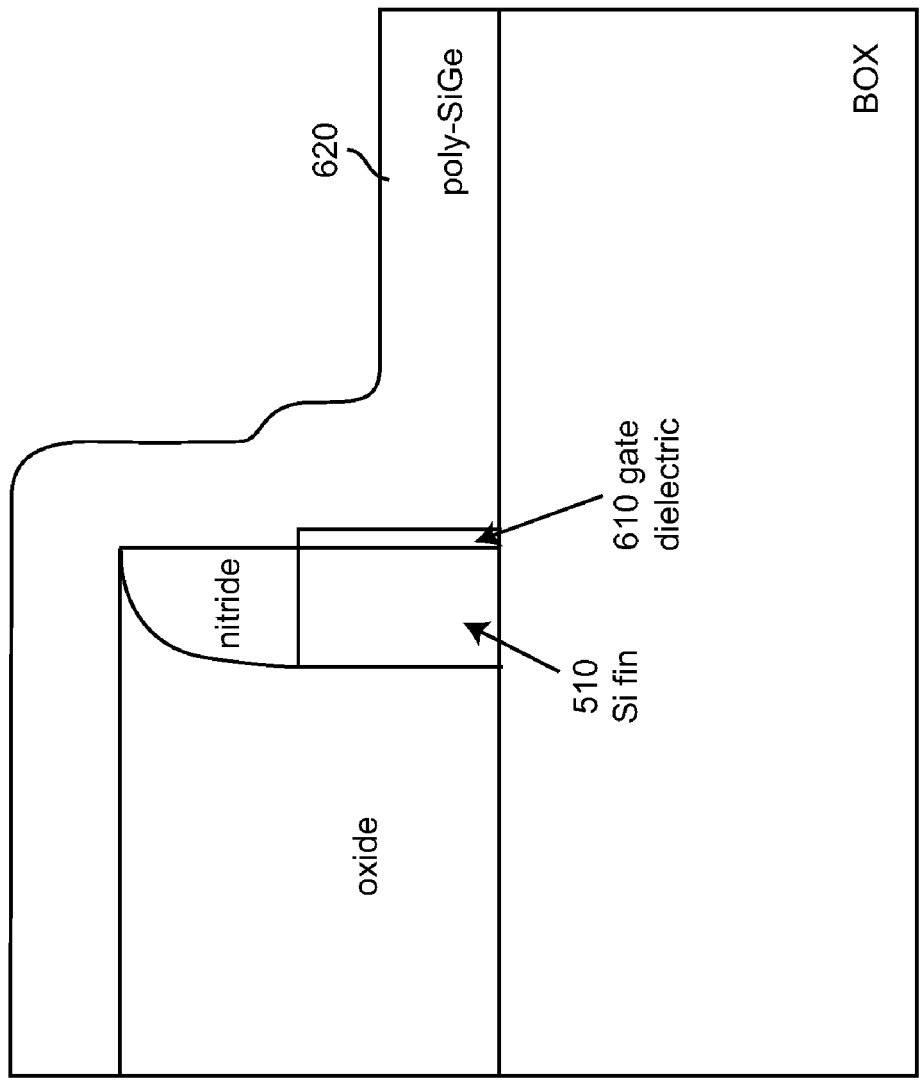
Figure 7:
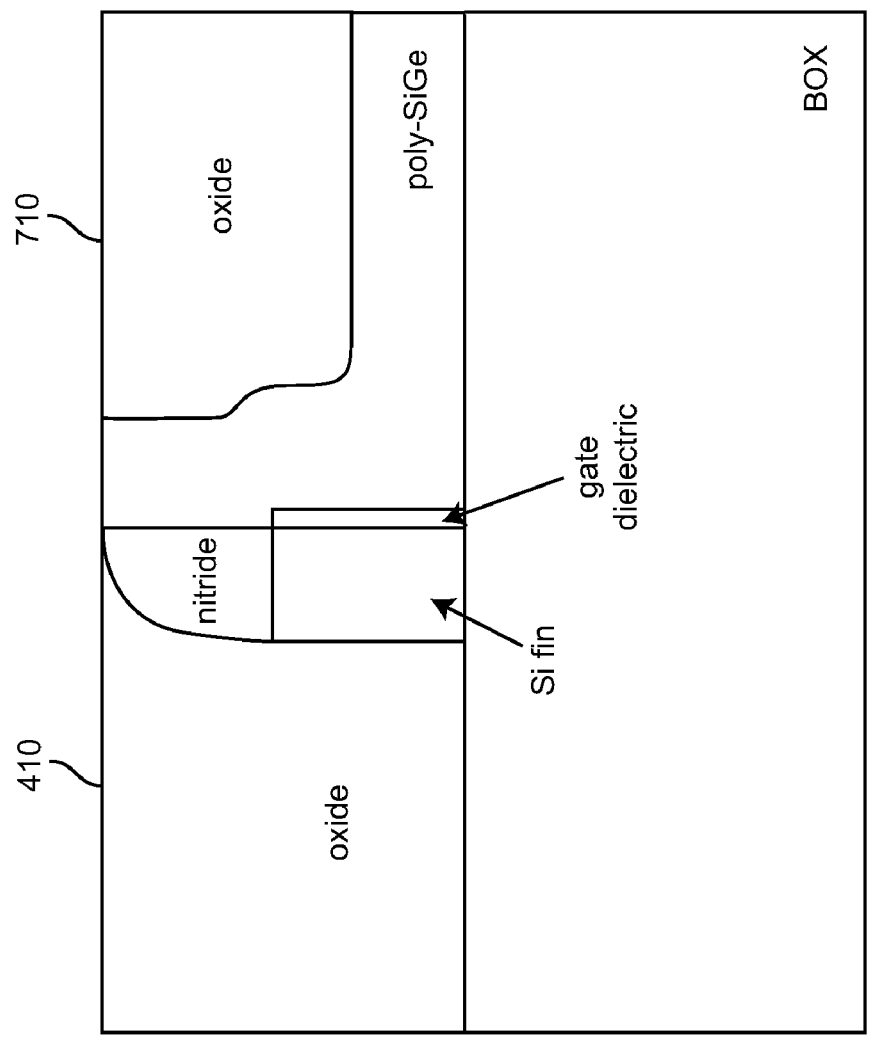
Figure 8:
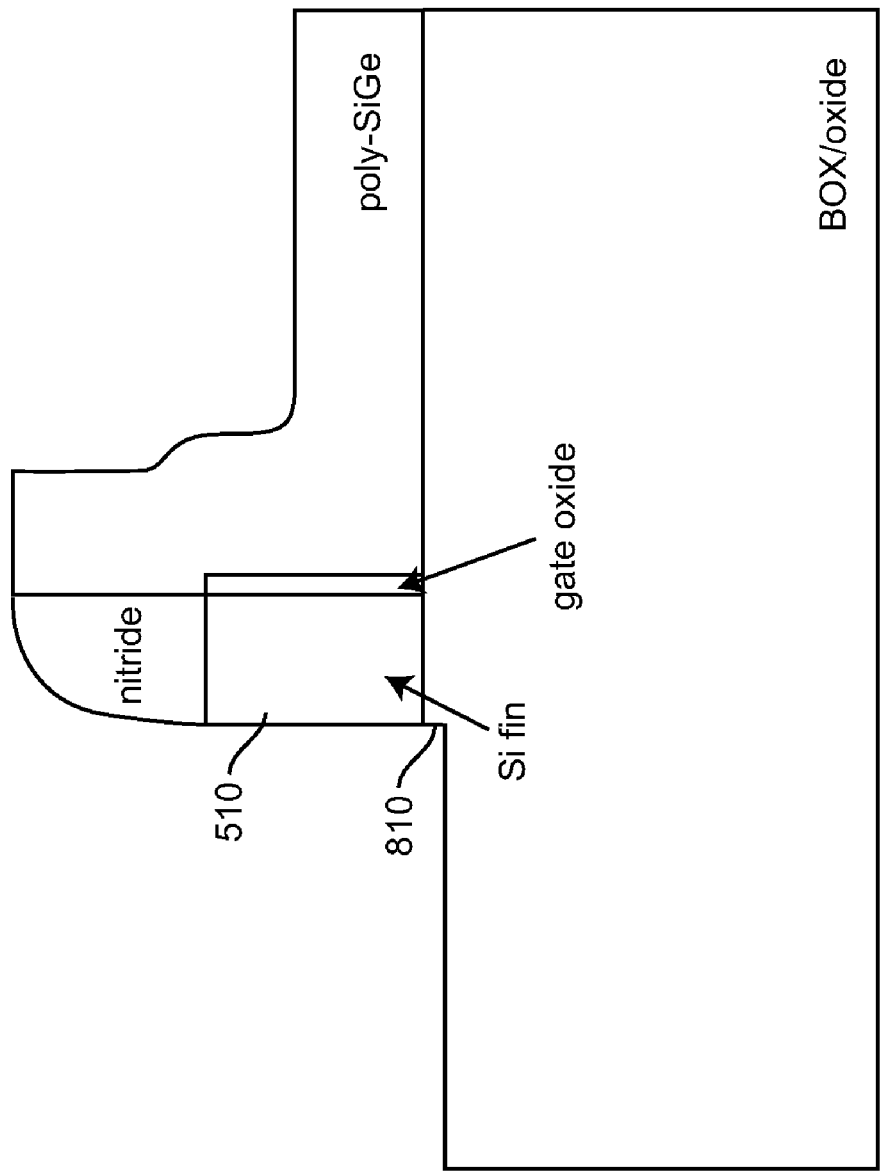
Figure 9:
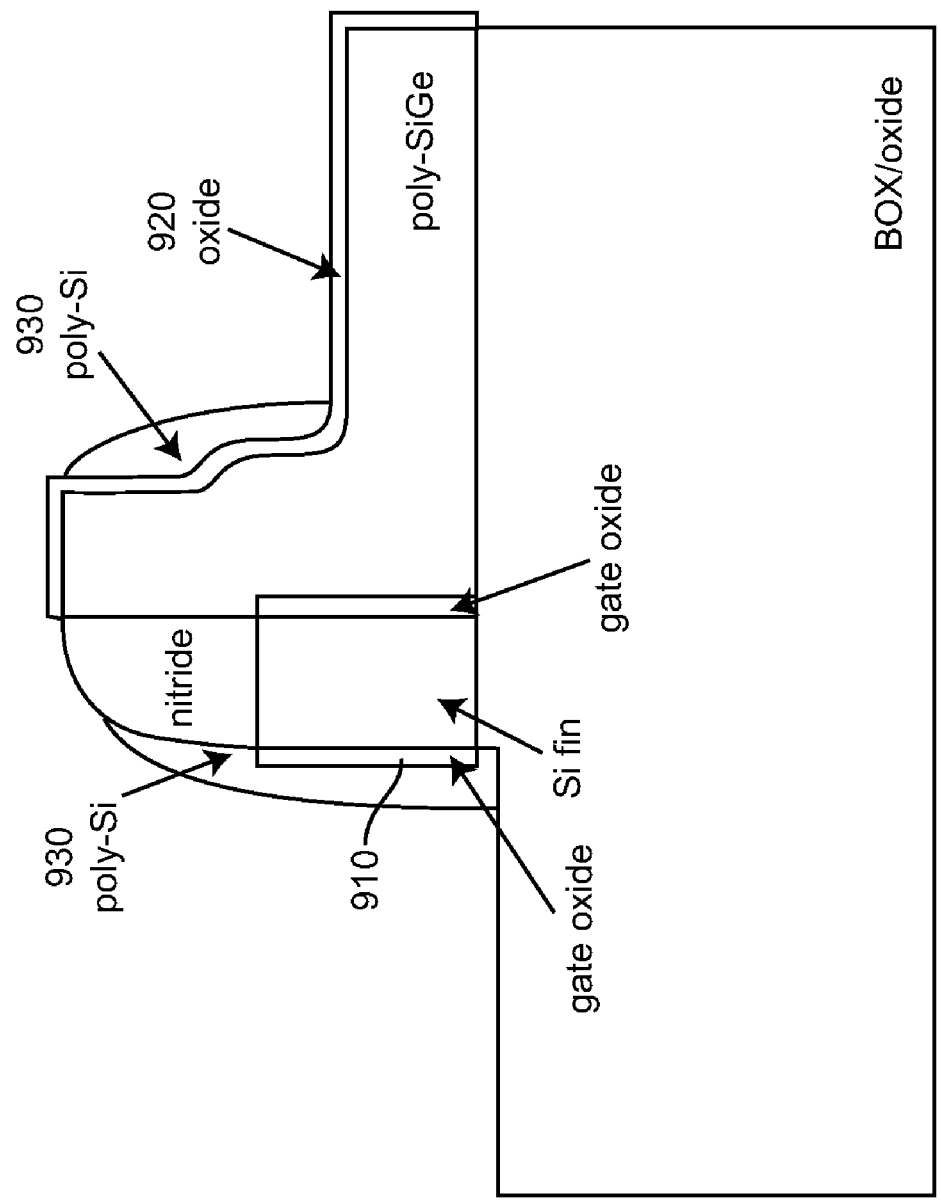

As shown in FIG. 6, a gate oxide preclean and gate dielectric process are performed to provide a gate dielectric, preferably by thermal oxidation and nitridization process or high-k dielectric deposition, depending on the gate materials desired a blanket poly-SiGe layer 620 is then deposited. Then, as shown in FIG. 7 a further oxide film is deposited by HDP or CVD and planarized using a chemical-mechanical polish (CMP) stopping on the nitride to yield oxide deposits 710 which are then removed along with the oxide 410 to expose the other side of the fin. A small degree of overetching onto the BOX layer 120 as shown at 810 is preferred to assure that the side of fin 510 is fully exposed and clean for formation of the second gate 910 by a thermal oxidation and nitridization or high-k dielectric deposition as with the first gate formation described above as shown in FIG. 9. This process also forms oxide or high-k dielectric layer 920. Poly-Si spacers 930 are then formed by deposition and a highly directional etch to assist in removal of a portion of layer 920 and to protect the gate dielectric 910.

Figure 10:
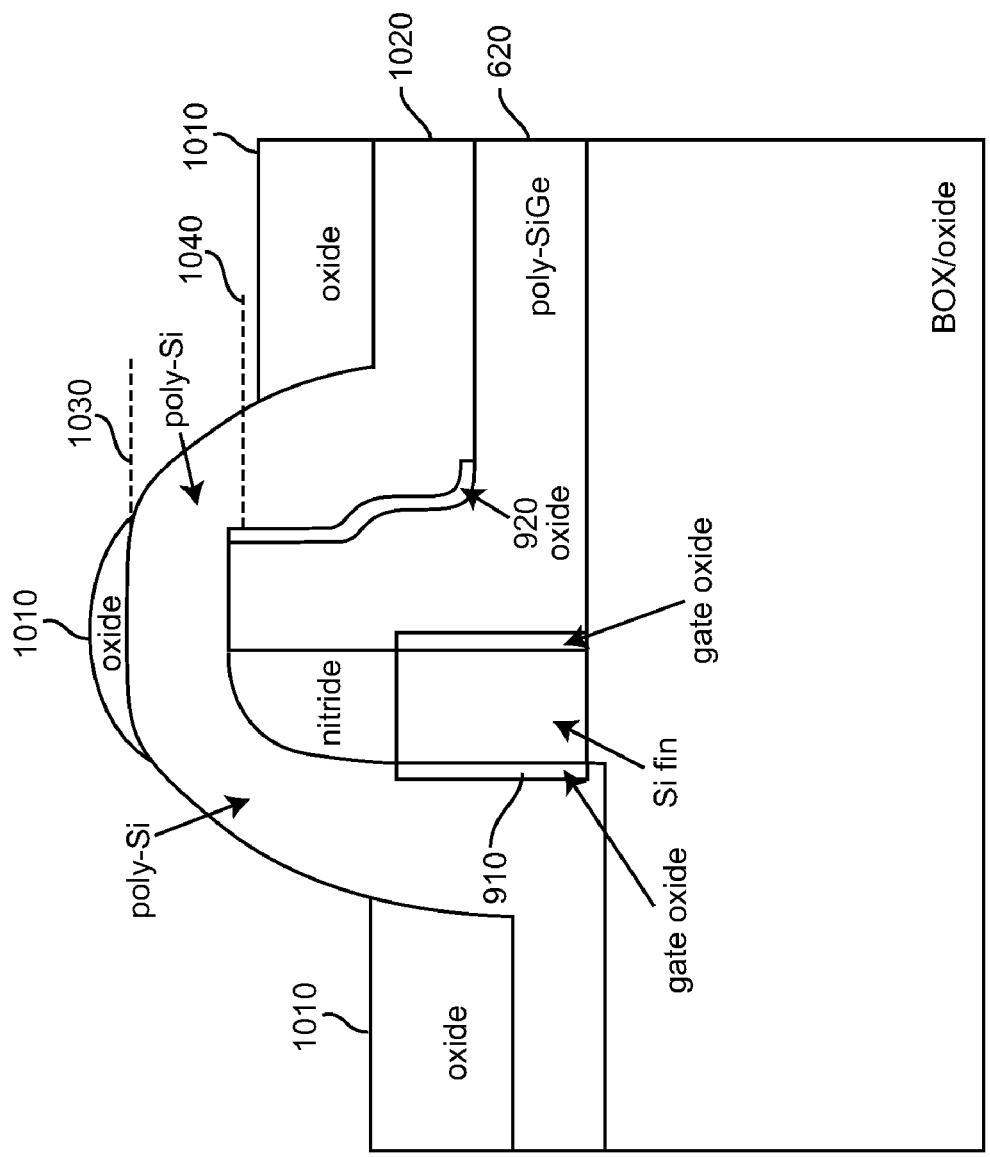
Figure 11:
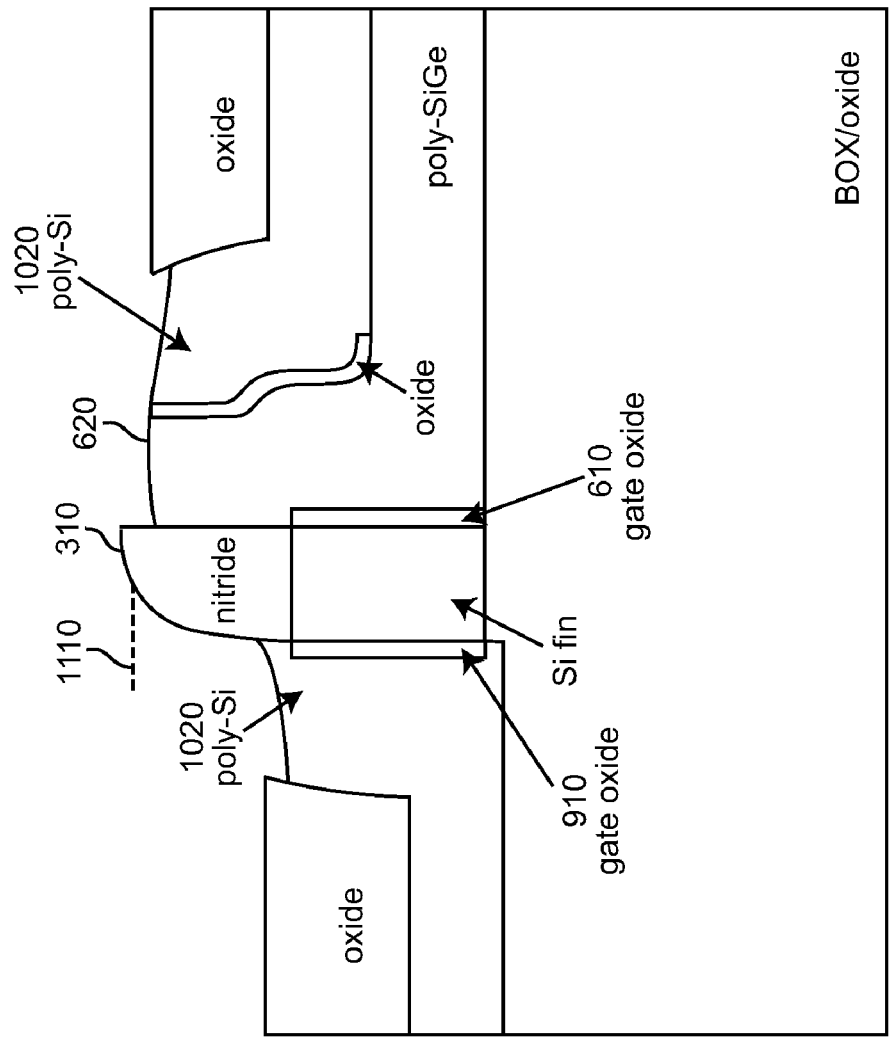
Figure 12:
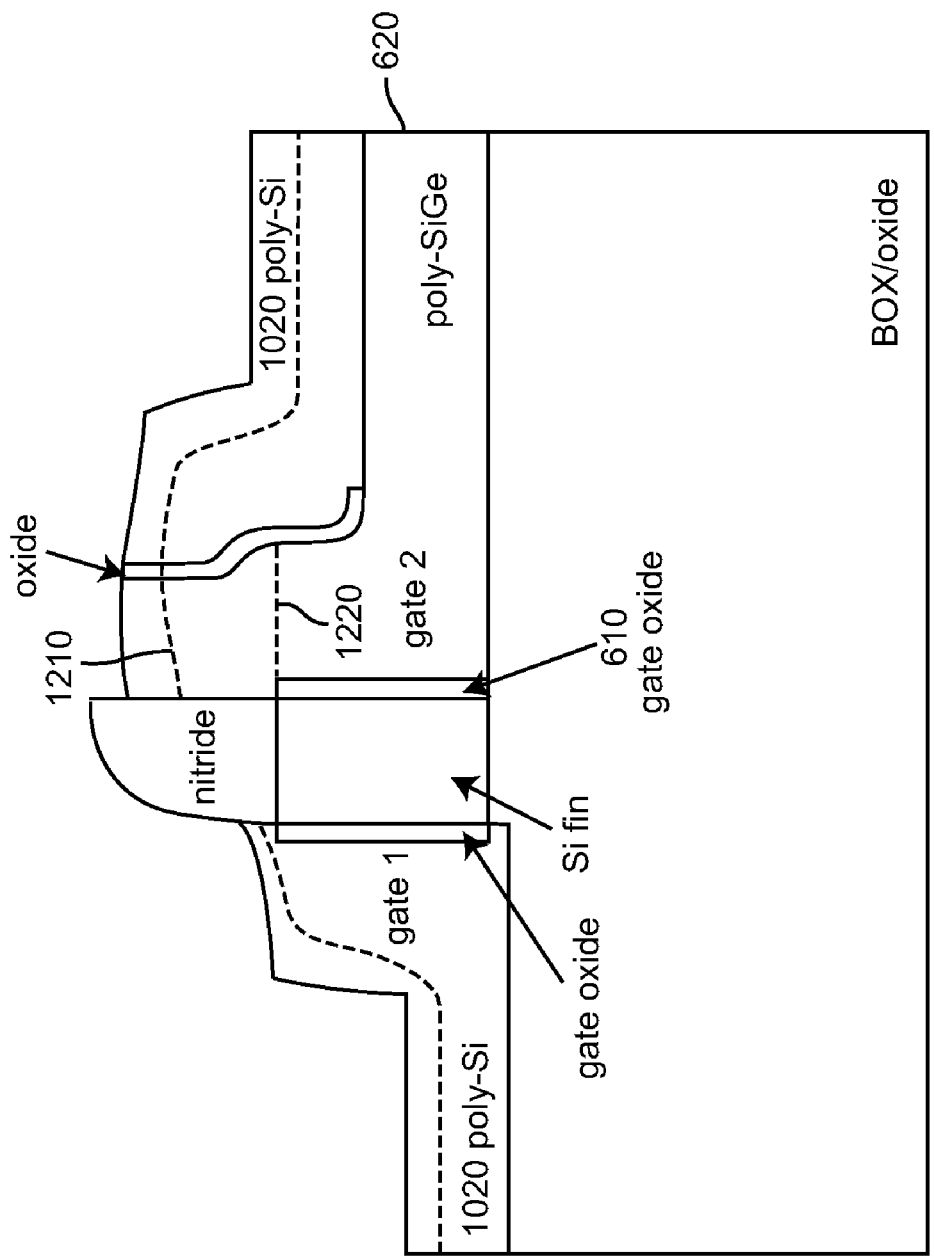

Then, as shown in FIG. 10, a thin oxide 1010 is formed above the poly-SiGe by depositing a poly-Si layer 1020 and then using a directional oxide deposition by high density plasma deposition (HDP). This results in the oxide above the fin being thinner than in other regions. Hydrogen fluoride (HF) is then preferably used to etch back the oxide above the fin and the poly-Si 1020 in order to disconnect the gates at gate dielectrics 610 and 910. Alternatively, this disconnection can be accomplished by further deposition of oxide which is then chemical mechanically polished back to the top of the poly-Si 1020 as indicated by dashed line 1030 in FIG. 10 and then etching the poly-Si 1020 to approximately the point indicated by dashed line 1040 or simply a chemical mechanical polish back to the top of nitride (e.g. to dashed line 1110 in FIG. 11) followed by etching of the poly-Si 1020 as shown at 1210 or 1220 to ensure complete disconnection. Following any of these gate disconnection processes, the remaining oxide 1010 is removed to result in the structure illustrated in FIG. 12. Conventional processes can be used from this point to complete the finFET but for the patterning of the gates and formation of the asymmetrical halo/SSRW structure which will be described below with reference to FIGS. 13 and 14. It should be appreciated that the structure shown in FIG. 12 is symmetric at and between the gate oxides but is otherwise asymmetrical; having poly-Si as a gate electrode on one side and a layered structure of poly-Si 1020 and poly-SiGe 620 as a gate electrode on the other. This asymmetry will facilitate other perfecting features of the invention as will be discussed below.

Figure 13:
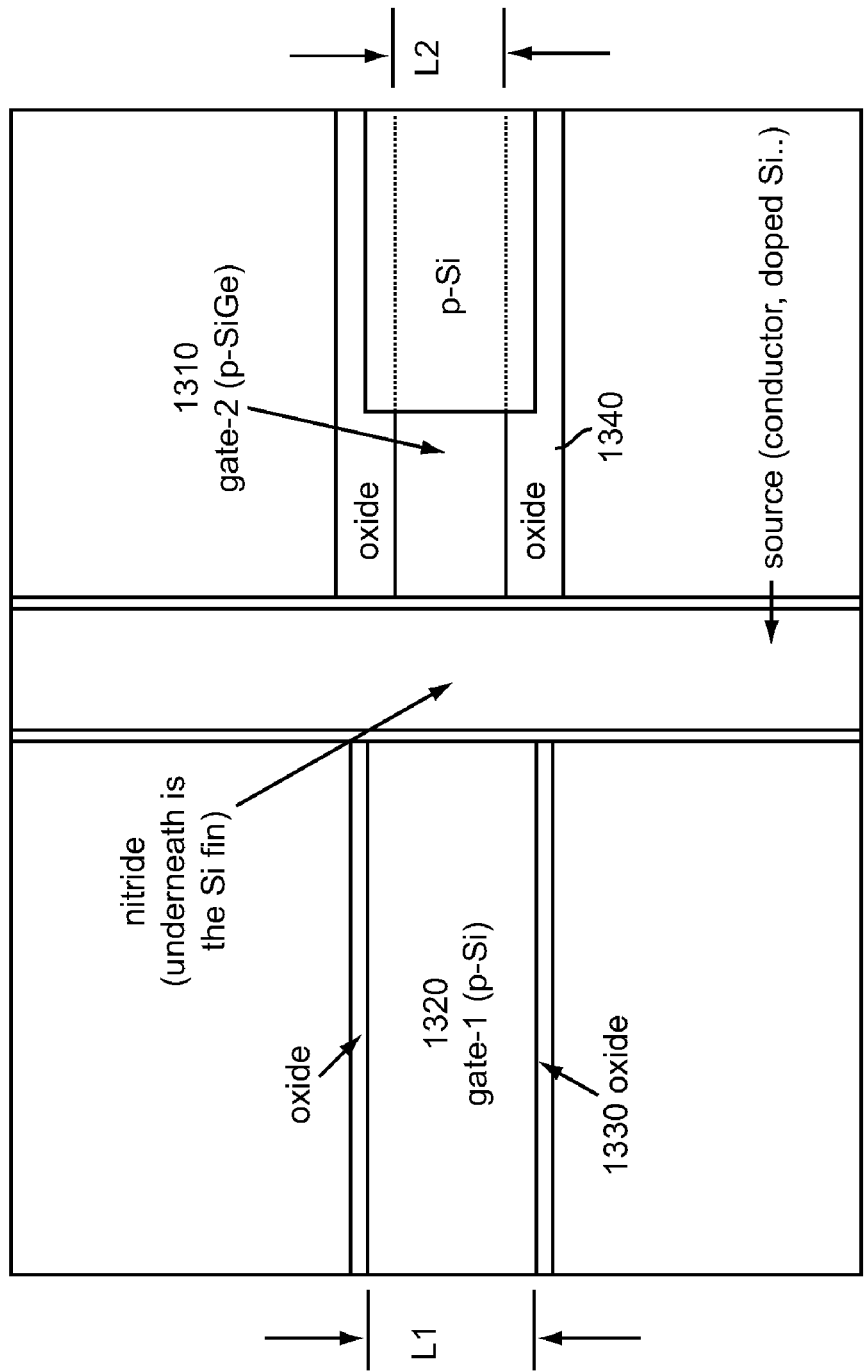
FIGS. 13 and 14 are plan views of steps completing the finFET in accordance with the first embodiment of the invention.

Referring now to FIG. 13, a photoresist is applied and patterned to define the areas of gate-1 (1320) and gate-2 (1310) followed by a reactive ion etch (RIE) stopping on the BOX layer 120 to form the gate conductors. The patterning of the resist and etching need not develop different dimensions of the gate conductors at this point. The sidewalls of the gate conductors are then oxidized. Since the oxidation rate of SiGe (gate-2, 1310) is larger than the oxidation rate of Si (gate-1, 1320), as may be appreciated from the difference in thickness of oxides 1330 and 1340, more of the SiGe of gate-2 1310 is consumed in the oxidation process than Si of gate-1 1320 resulting in a smaller gate length L2 for gate-2 than the gate length L1 of gate-1.

It is desirable that the so-called back gate, gate 2, (corresponding to the first-formed gate insulator 610 formed as discussed above) 1310 to be used for controlling $V_t$, be shorter in the conduction direction than the so-called front gate, gate 1, 1320 opposing it across the fin/conduction channel in order to reduce capacitance. This is achieved by the oxidation process described above. Since the oxidation rate of poly-SiGe is approximately three times the oxidation rate of poly-Si, much more of the poly-SiGe is consumed and the gate length L2 of gate 2 (1310) is preferably reduced (e.g. made different or smaller) relative to the length L1 of gate 1 (1320) in a single common process which is well-controlled and reliably repeatable. length L2 of gate 2 (1310) is preferably reduced (e.g. made different or smaller) relative to the length L1 of gate 1 (1320) in a single common process which is well-controlled and reliably repeatable.

Figure 14:
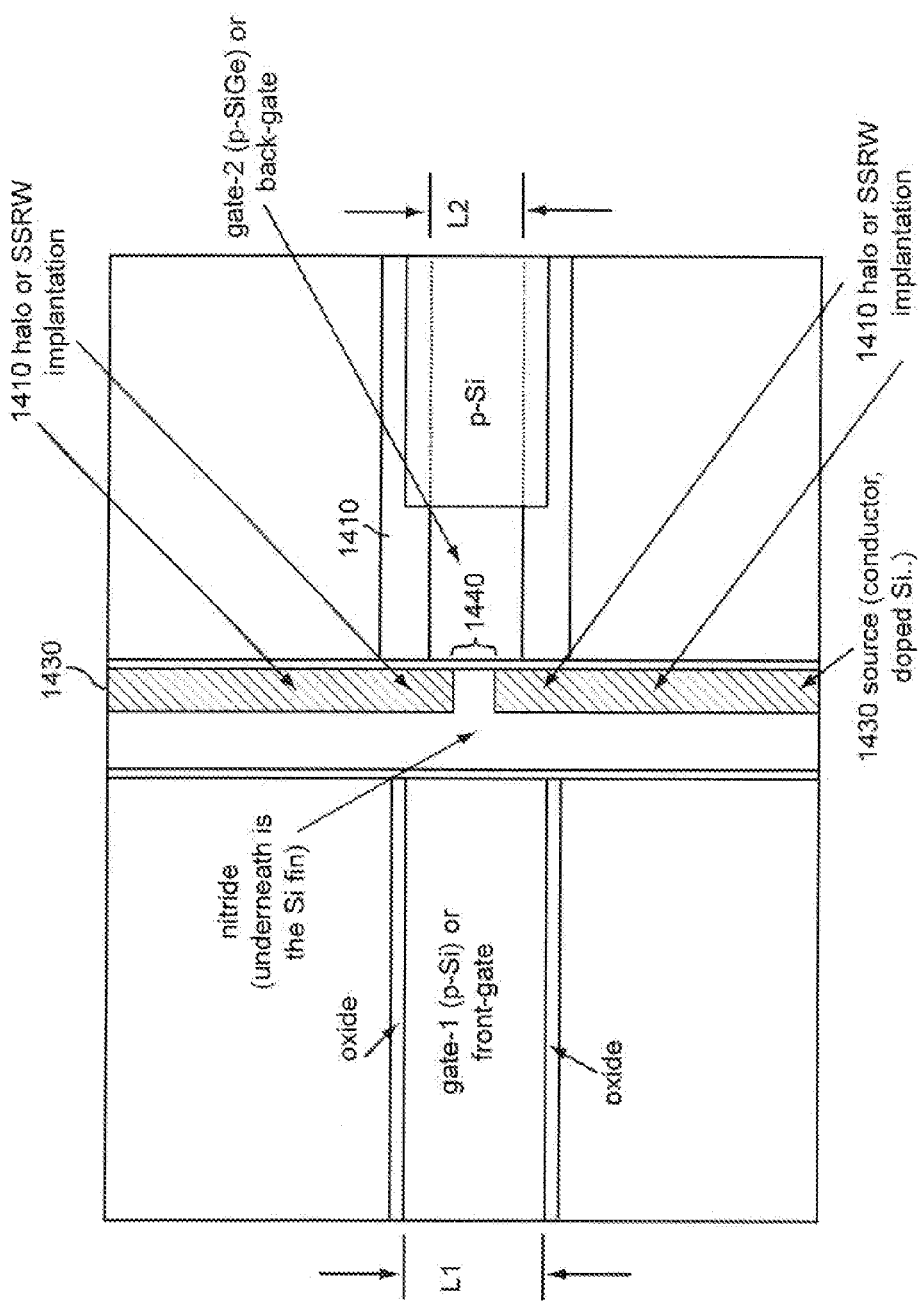

Referring now to FIG. 14, an important feature of the present invention will now be discussed. It has been recognized by the inventors that the geometry of a finFET allows extension implants to be provided in the channel in regard to each of the respective gates 1310, 1320 and that, if this is done (e.g. asymmetrically across the channel using an angled implantation), the effect in the channel for one gate may provide a quite different structure with much different effects than for the other gate. More specifically, the inventors have recognized not only that the reduction of short channel effects for gate 2, 1310, the shorter of the two gates, by use of a halo implant will also serve as a super-steep retrograded well (SSRW) in regard to the other gate, gate 1, 1320, and will serve to reduce short channel effects (SCE) in the portion of the channel controlled by gate 1, 1320, without degrading carrier mobility but that the degrading of carrier mobility in the portion of the channel controlled principally by gate 2, 1310, is of no significant consequence since gate 2, 1310 is used to control the switching threshold of the finFET and little significant conduction or control of conduction occurs therein (e.g. in the portion of the channel/fin adjacent gate 2 1310). This dual-function structure is formed simply by providing an angled implantation implant into the side of the channel proximate to gate 2 using the gate 2, 1310, oxide 1410 and nitride sidewall 310 as a mask to form halo implant/SSRW 1430 as shown in FIG. 14.

It should be noted that the halo/SSRW angled implant is partially masked by gate 2 and thus the dopant concentration or distribution varies along the direction of electrical current flow in the channel of the finFET as indicated by bracket 1440. The location of variations of distribution and dopant concentration profile can be varied by variation of the angle of the dopant implantation, variation of implant energy and heat treatment and the like as is well understood in the art.

A second exemplary embodiment of the invention will now be described in connection with FIGS. 15-24. It should be understood that both of the embodiments described herein are intended as exemplary methods of making finFETs having the meritorious effects described above by forming a halo implant and SSRW for the respective gates with a single structure although the respective methods develop slightly different structures; the salient features of which will be described below in connection with FIGS. 25 and 26. It is also to be understood that some steps of one embodiment may be used with steps of the other and that a range of suitable steps will be apparent to those skilled in the art from the differences in methodology of the two exemplary embodiments described herein.

Figure 15:
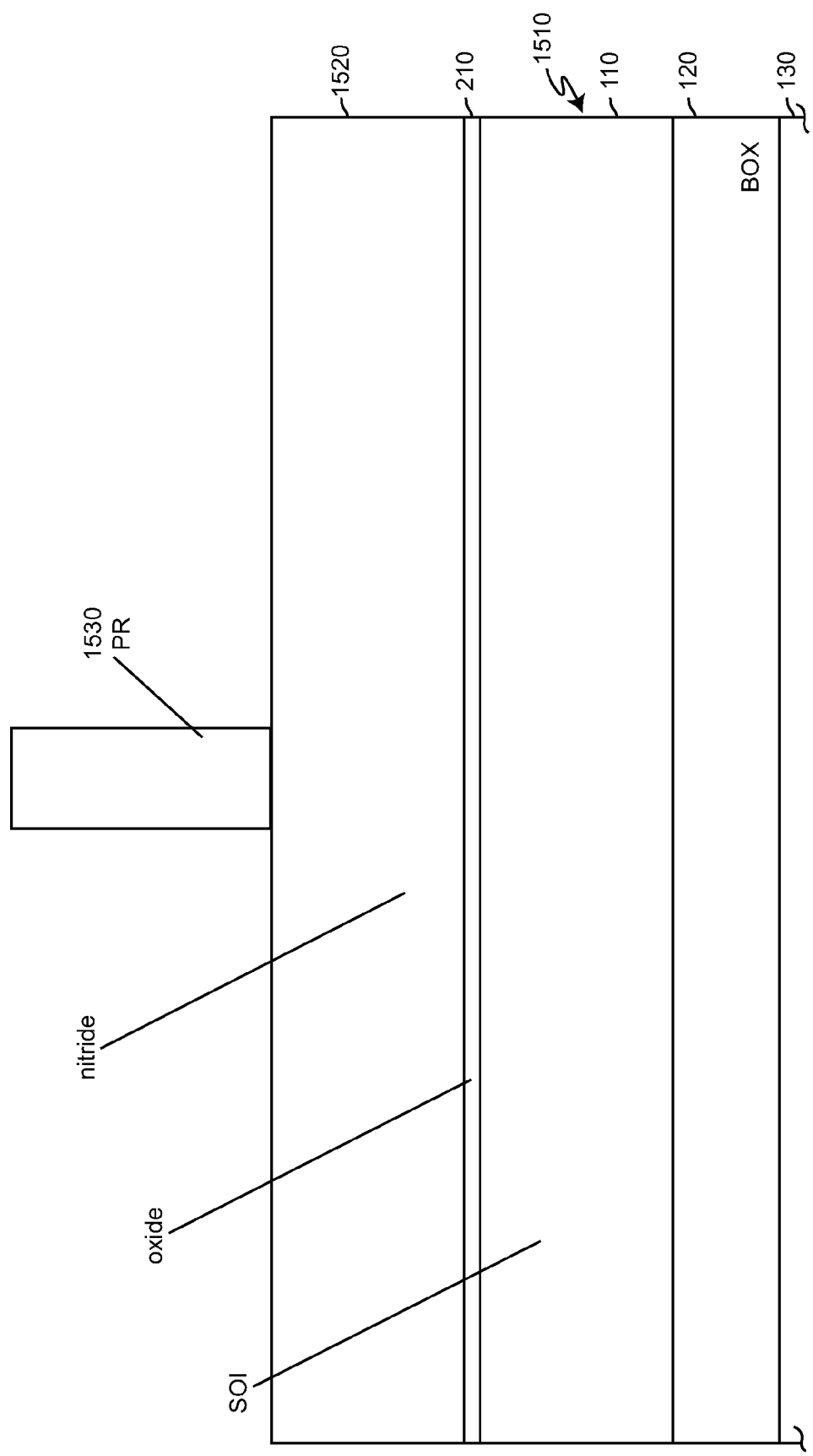
FIGS. 15 and 16 are cross-sectional views of initial stages of making a second exemplary embodiment of the invention.
Figure 16:
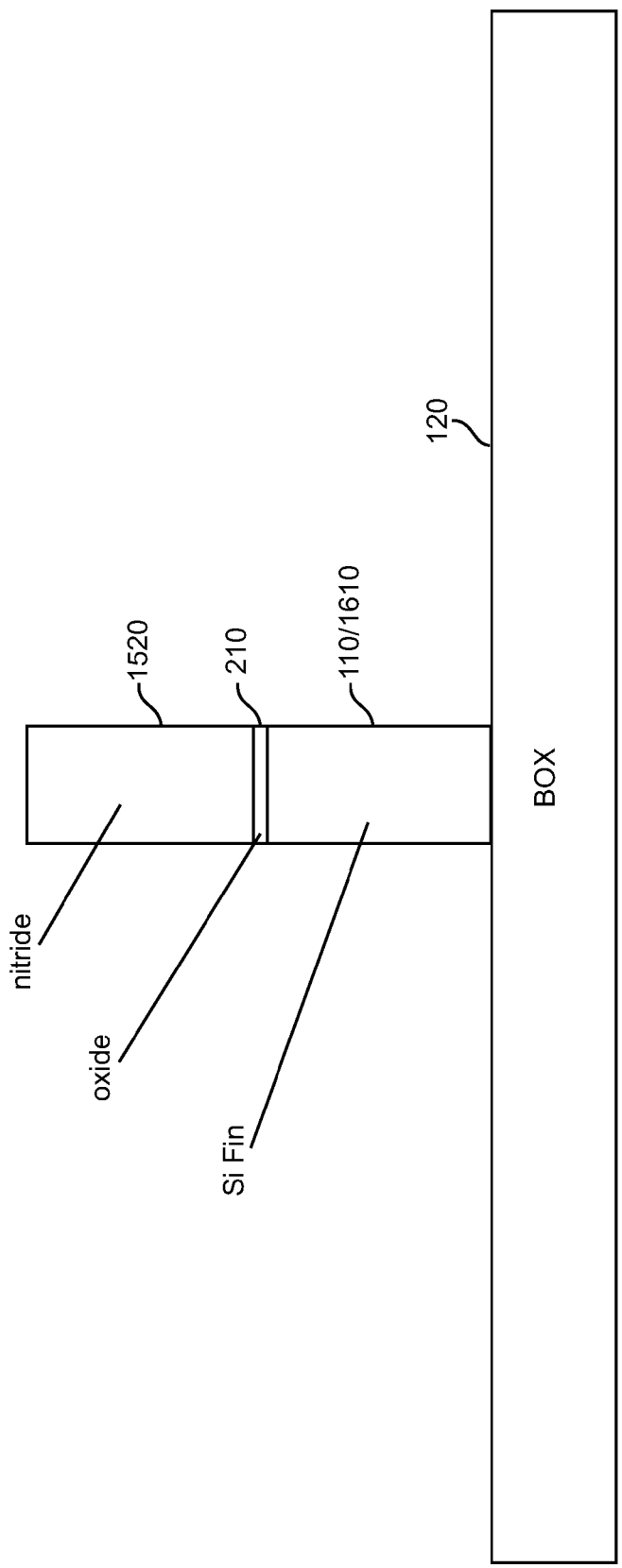

FIG. 15 also illustrates starting with an SOI wafer 1510 comprising an SOI layer 110, and insulator (BOX) layer 120, and a handling substrate 130. However, as before, it is only necessary to have a silicon layer over an insulator layer since the handling substrate and the insulator layer are not affected by the method of making either embodiment of the invention. As with the first embodiment, a thin oxide layer 210 is then formed on semiconductor layer 110 which is preferably silicon in this second embodiment. In this second embodiment, however, a layer of nitride 1520 is deposited over the thin oxide 210. Then a resist 1530, preferably a photoresist, PR, is applied over the nitride and patterned, as shown, to define the location of the finFET channel. The nitride 1520, thin oxide 210 and semiconductor 110 are then etched to the insulator/BOX 120 to form the fin 1610 (with overlaid thin oxide and nitride) and the resist is removed, as shown in FIG. 16.

Figure 17A:
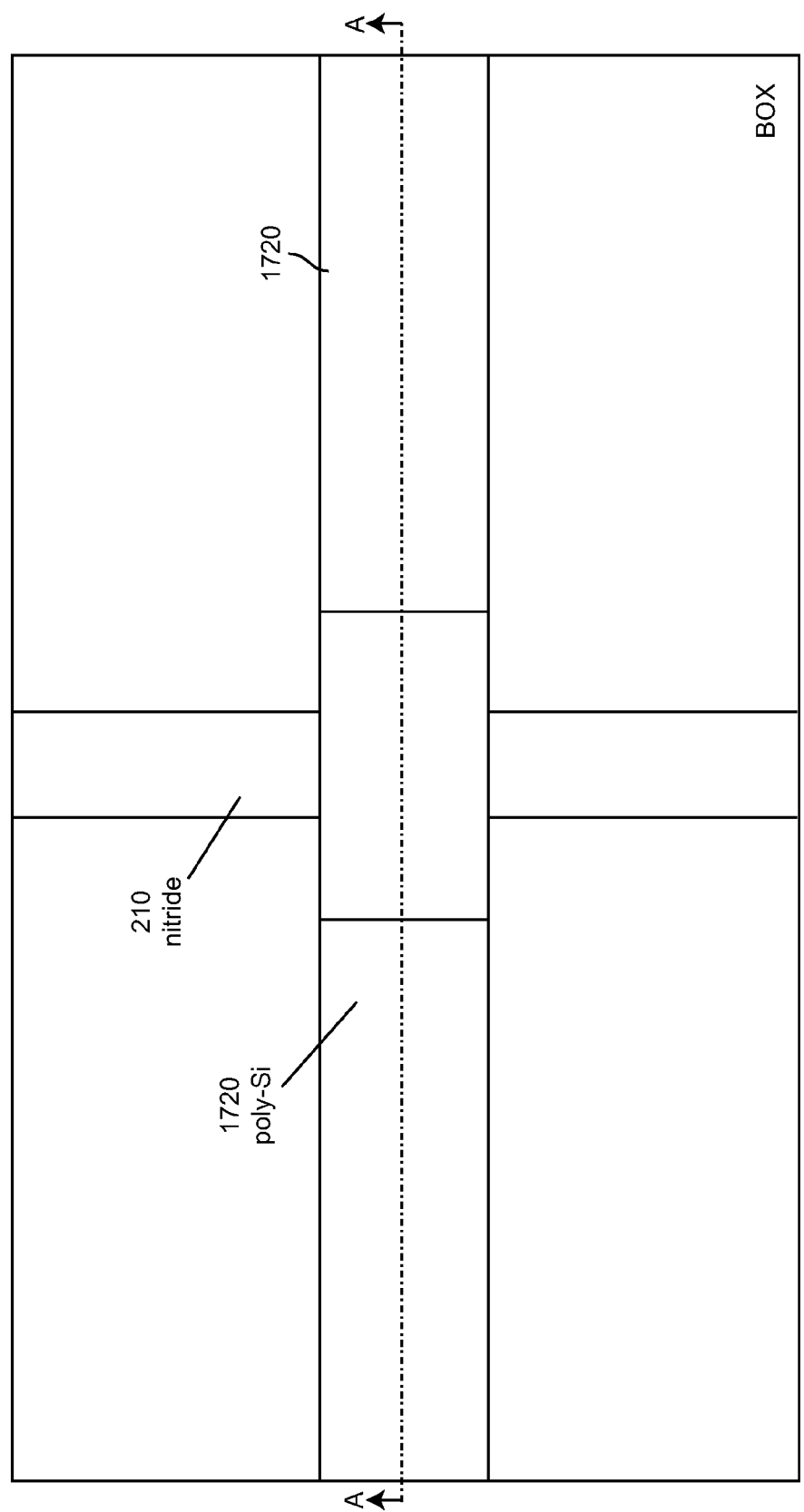
FIGS. 17A, 17B, 18A, 18B, 19A, 19B, 20A, 20B, 21A, 21B, 22A, 22B, 23A, 23B and 24 are top and cross-sectional views of intermediate stages of making the second exemplary embodiment of the invention.
Figure 17B:
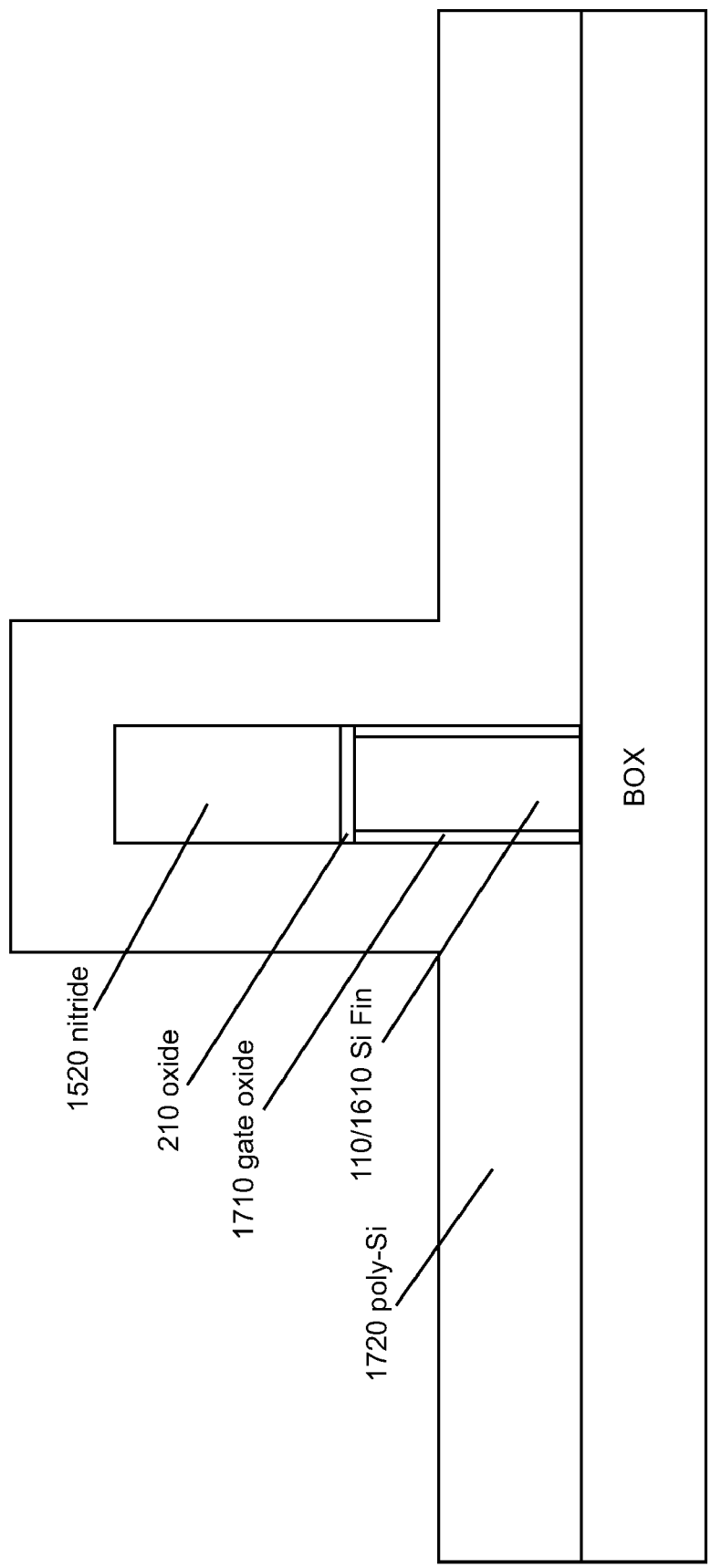

FIGS. 17A and 17B follow conventional processes for forming a structure which will become gate structures in the completed transistor: the sides of the semiconductor fin 1610 are oxidized to develop a gate oxide 1710, poly-Si 1720 is deposited followed by a resist which is patterned and the poly-Si etched to define the gate conductors. The resist (not shown) is then removed to result in the structure shown in FIGS. 17A and 17B.

Figure 18A:
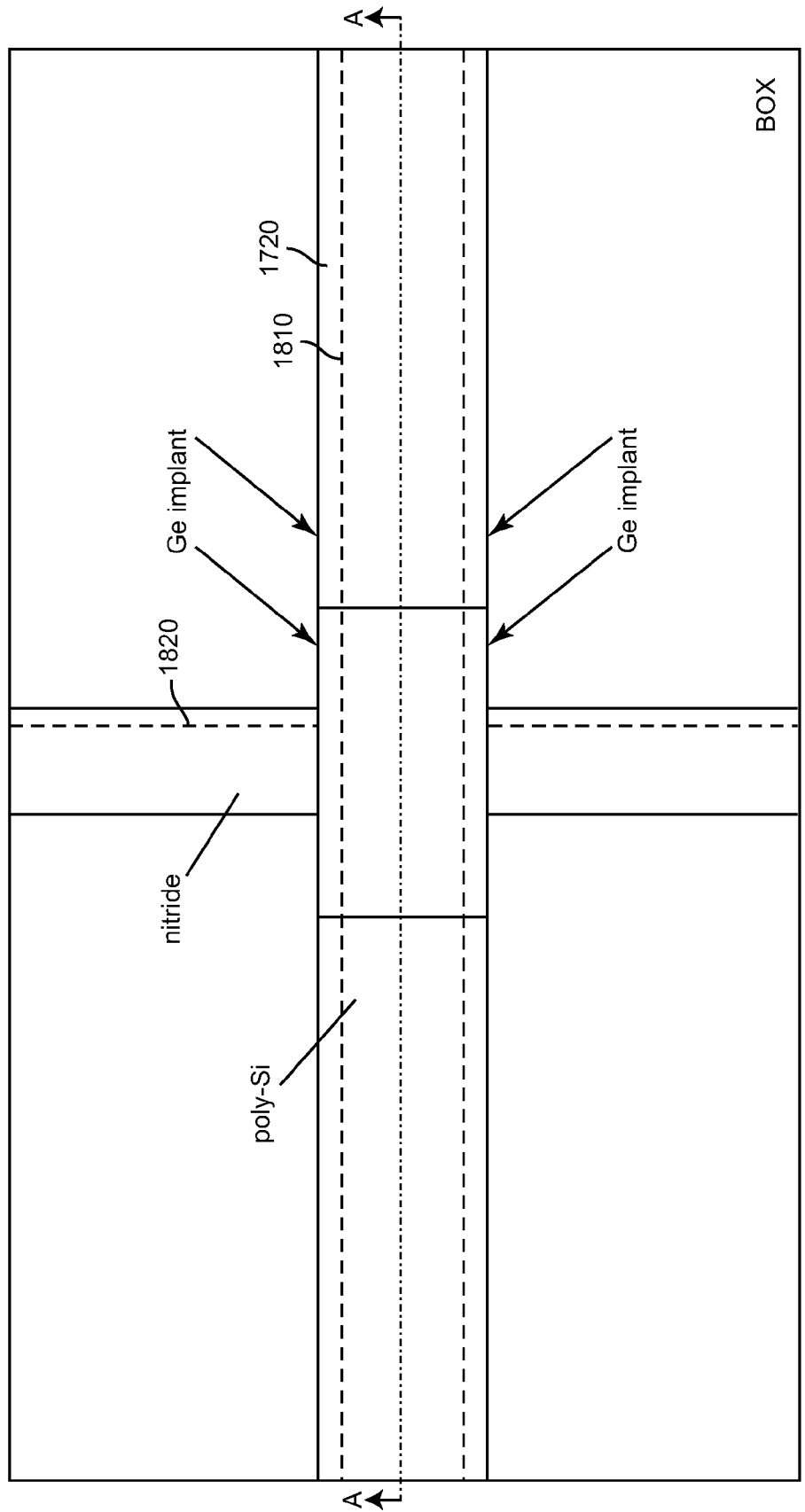
Figure 18B:
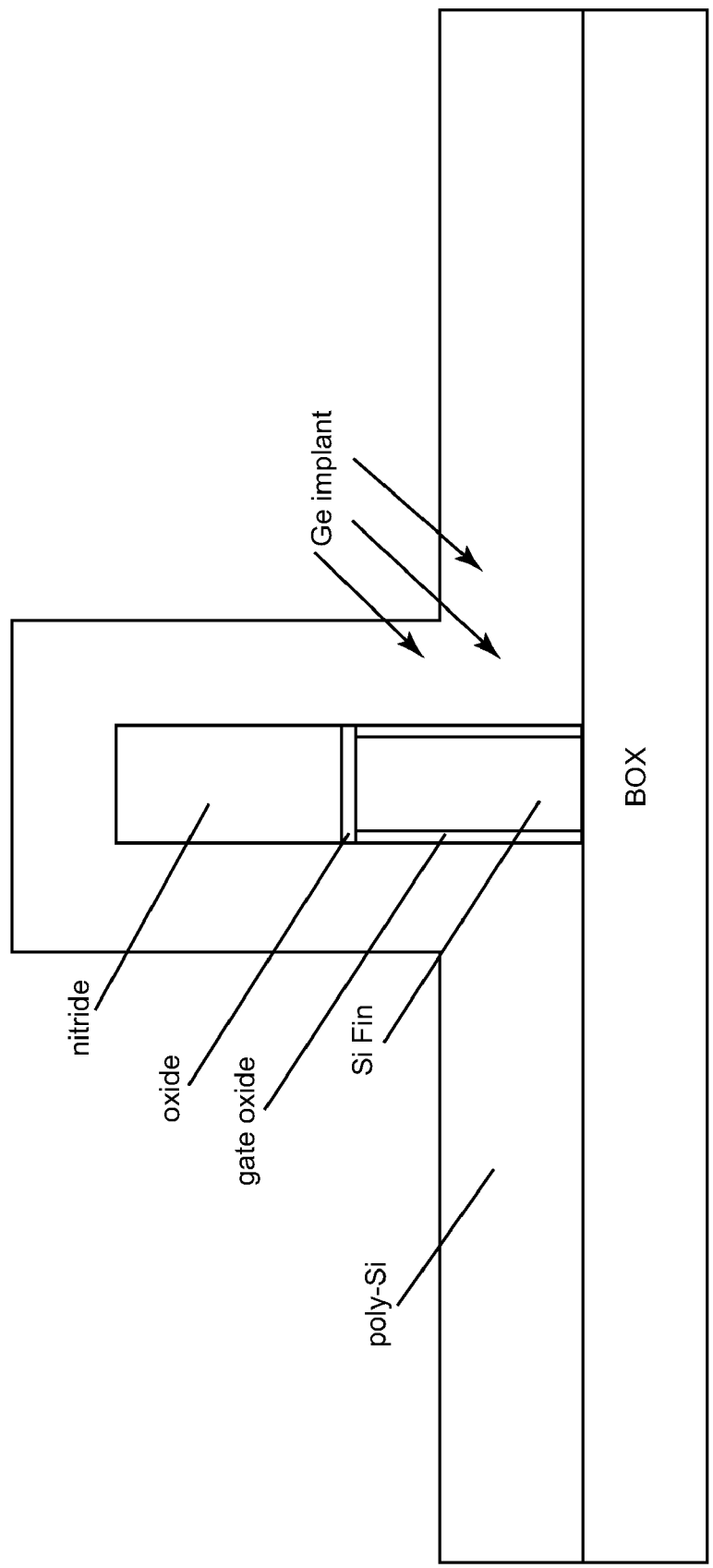
Figure 19A:
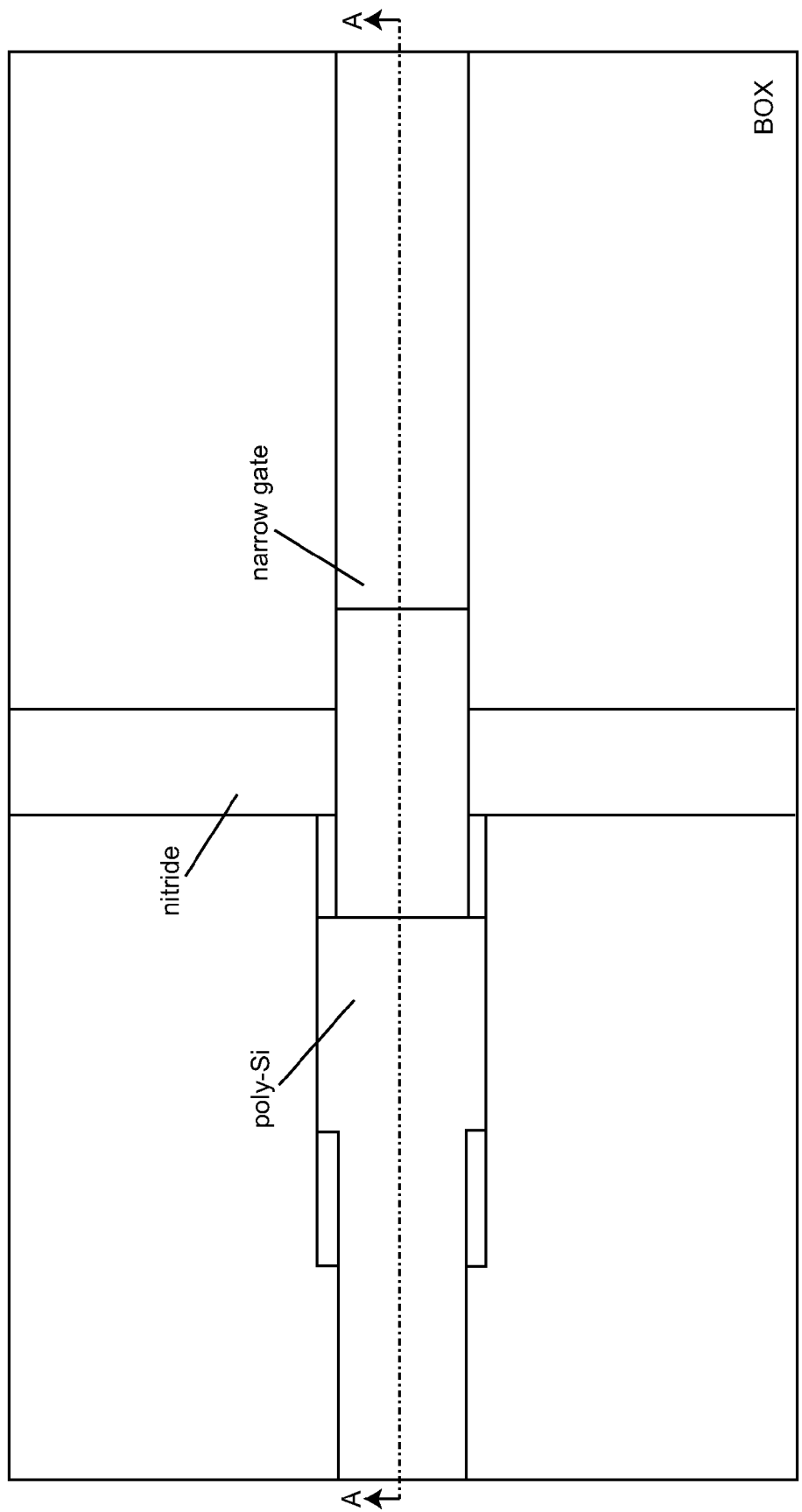
Figure 19B:
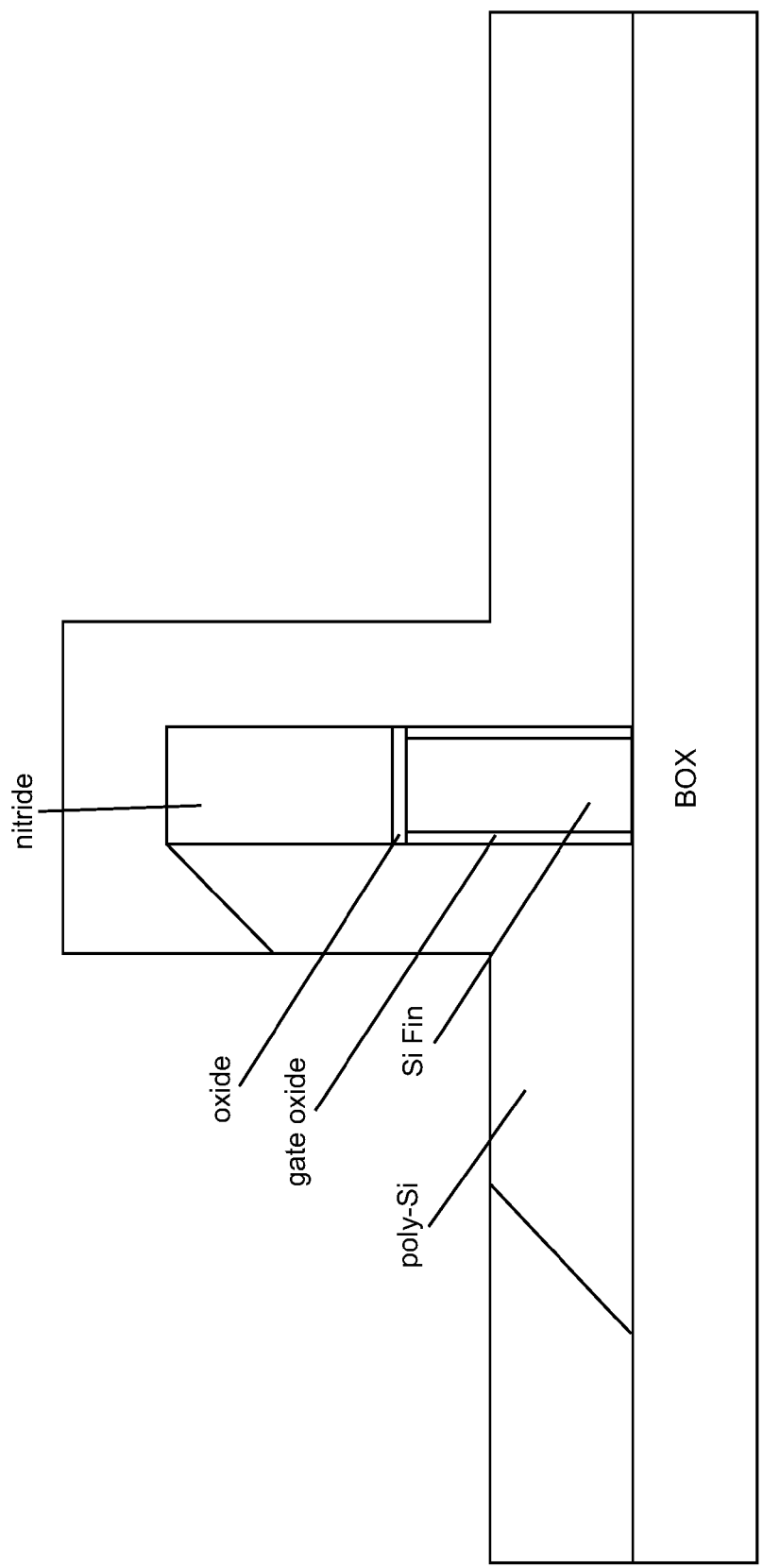

To form gates of different lengths, an angled germanium (Ge) implant is then performed as shown in FIGS. 18A and 18B to obtain additional Ge concentration in the sides of the poly-Si 1720, as indicated by dashed lines 1810. The angle of this implant is not critical to the successful practice of the invention but should preferably be chosen to favor implantation in the sides of the poly-Si structure. This Ge concentration increases the etch rate of the poly-Si so that a differential width of poly-Si can be developed on opposite sides of the fin 1610 where the poly-Si is shadowed and protected from the Ge implant on the left (as illustrated) side of the fin. Ge will also be implanted in the side (right side, as illustrated) of the fin 1610 as shown at 1820 but is of no effect since it is outside the gate area (masked by the poly-Si) and the outside regions of the fin are protected from etching by the overlying nitride 210 and oxide formed concurrently with the gate oxide. This etch, preferably selective to oxide and nitride develops the structure illustrated in FIGS. 19A and 19B.

Figure 20A:
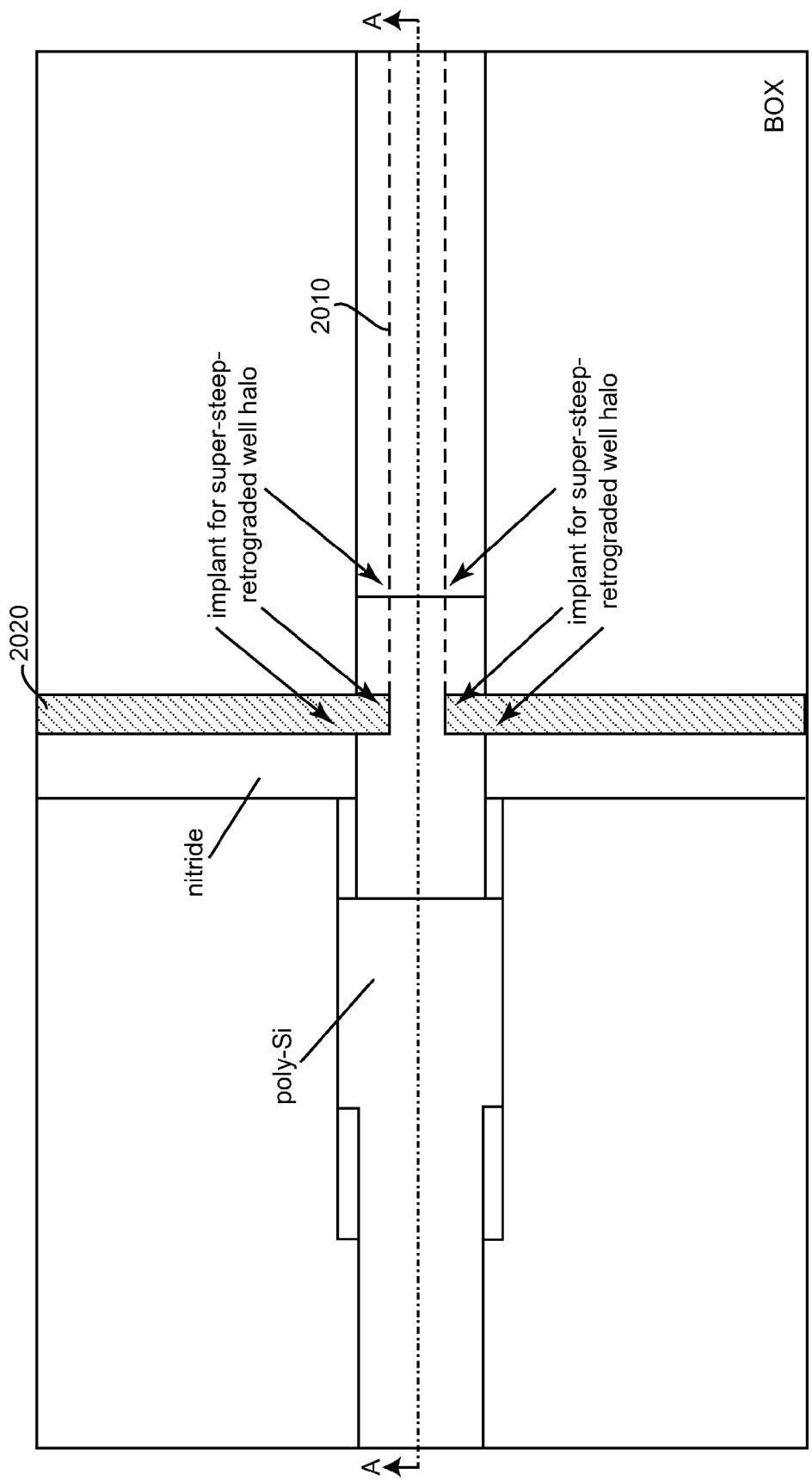
Figure 20B:
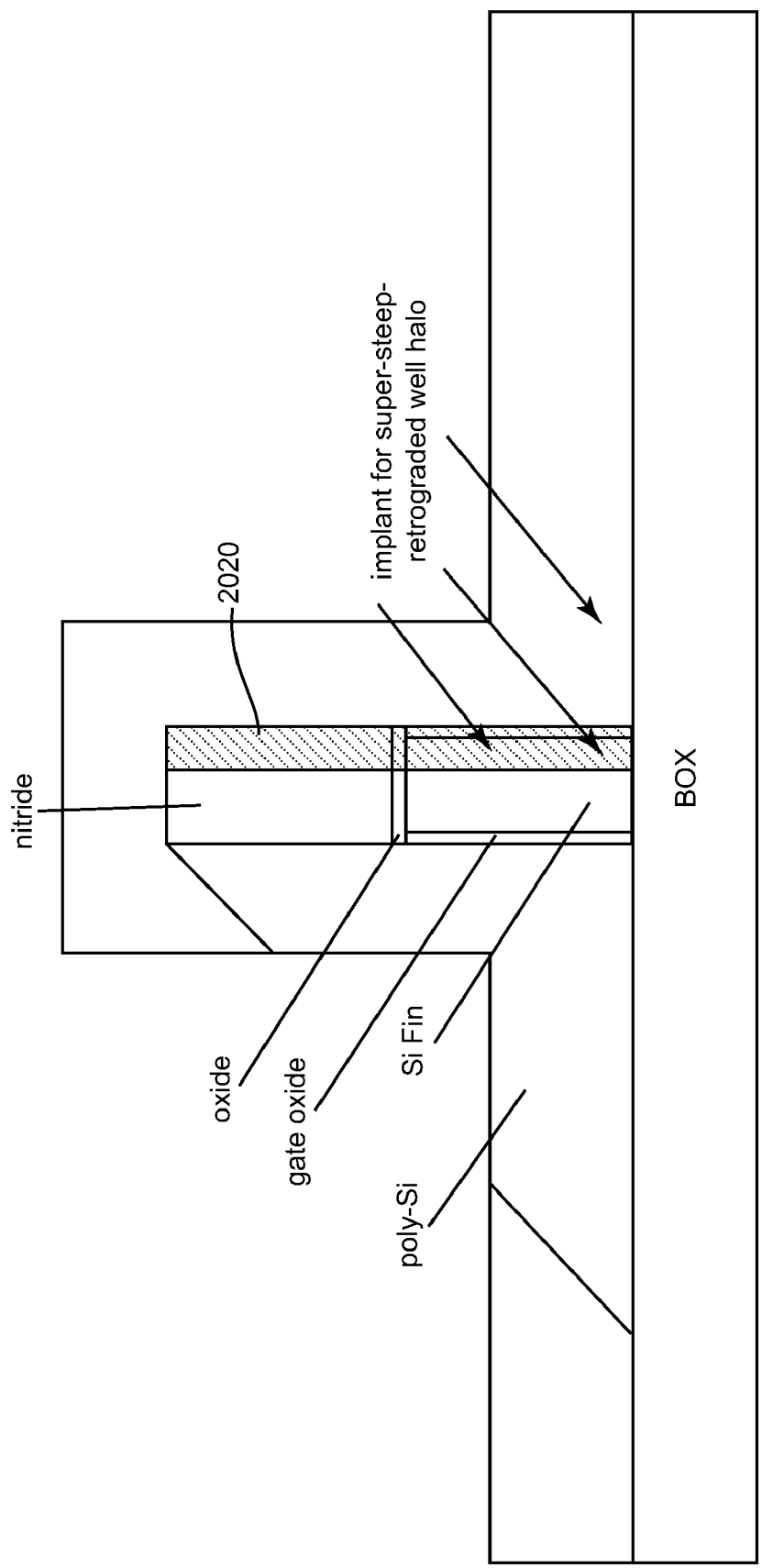

Then, as illustrated in FIGS. 20A and 20B, another angled implant of boron (B) and BF2 for n-type finFETs or arsenic and/or antimony for p-type finFETs is performed to form the asymmetric halo implant/SSRW structure 2020. Again, the angle is not critical to the successful practice of the invention but the angle is preferably chosen to favor implantation in the fin but can be varied, possibly in connection with variation of other implantation and heat treatment parameters to adjust variation of dopant concentration and distribution profile in the direction of current flow in the channel of the finFET as discussed above in connection with the first embodiment of the invention. Also, as with the angled implant discussed above in connection with FIG. 17A and 17B, some impurities will be implanted in the poly-Si structure as shown at 2010 but are of no significant effect other than the possible beneficial effect of reducing resistance of the poly-Si. The resulting implant in the fin 1610 and nitride 210 is depicted by shading in FIGS. 20A and 20B and following Figures.

Figure 21A:
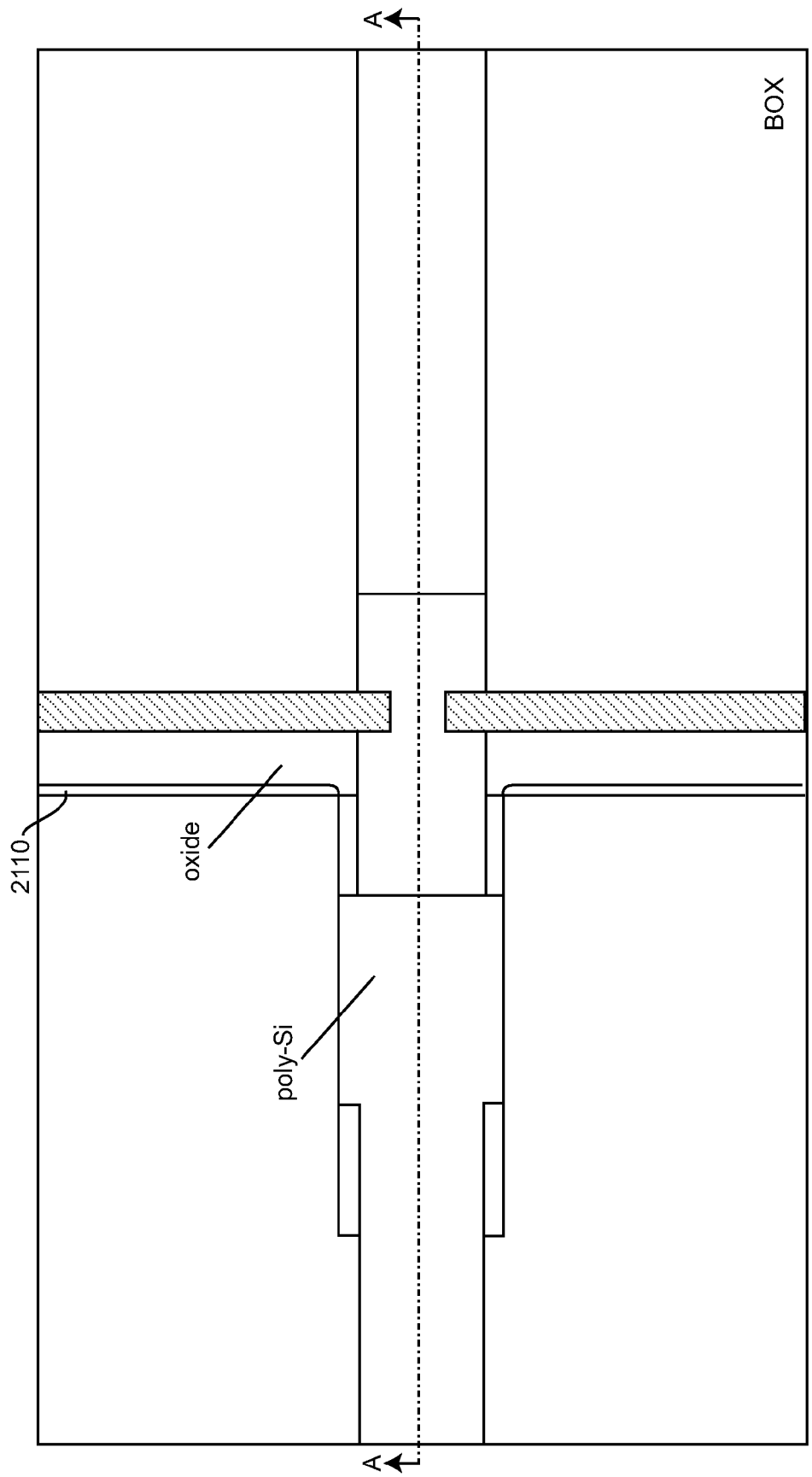
Figure 21B:
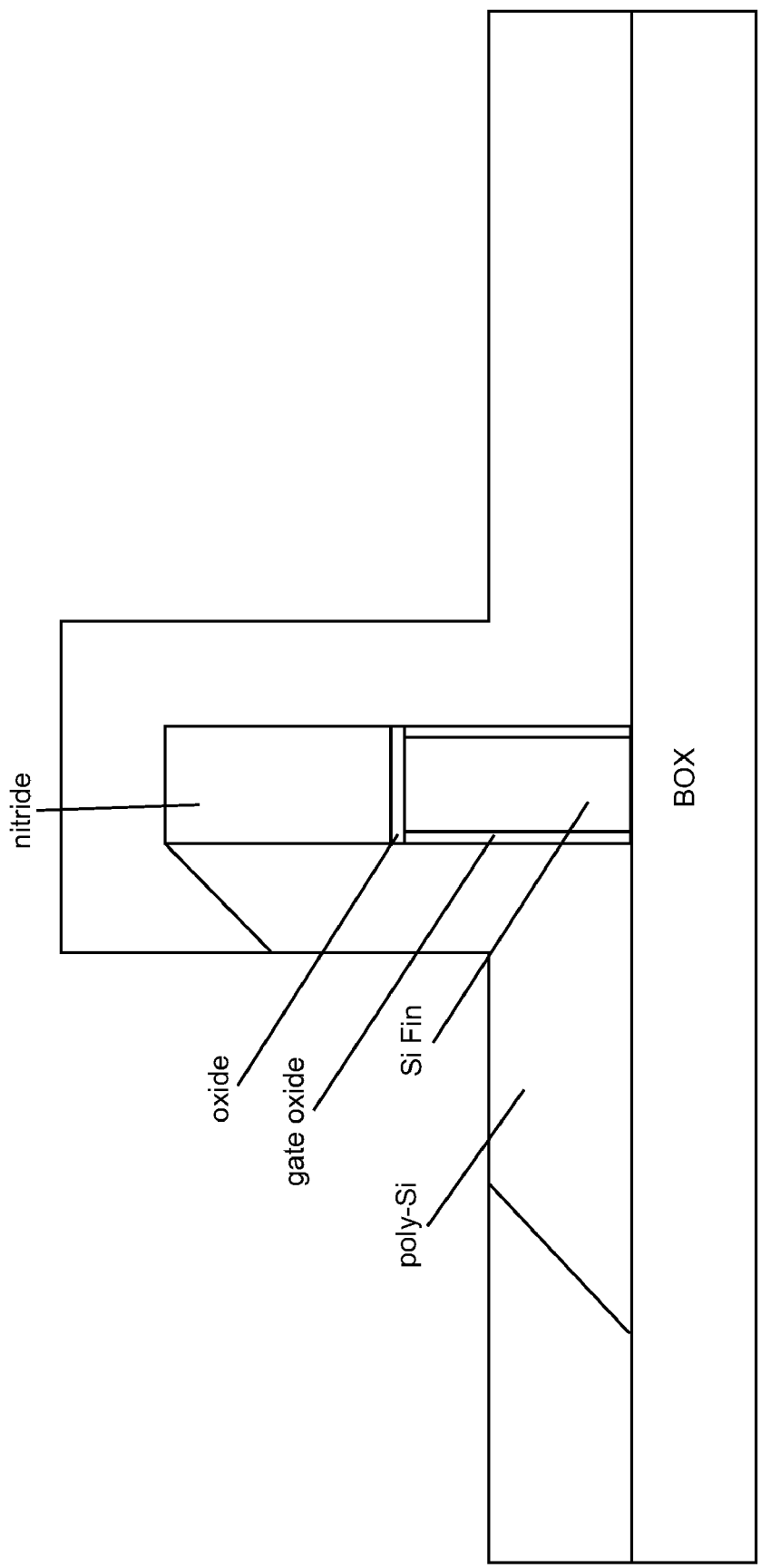
Figure 22A:
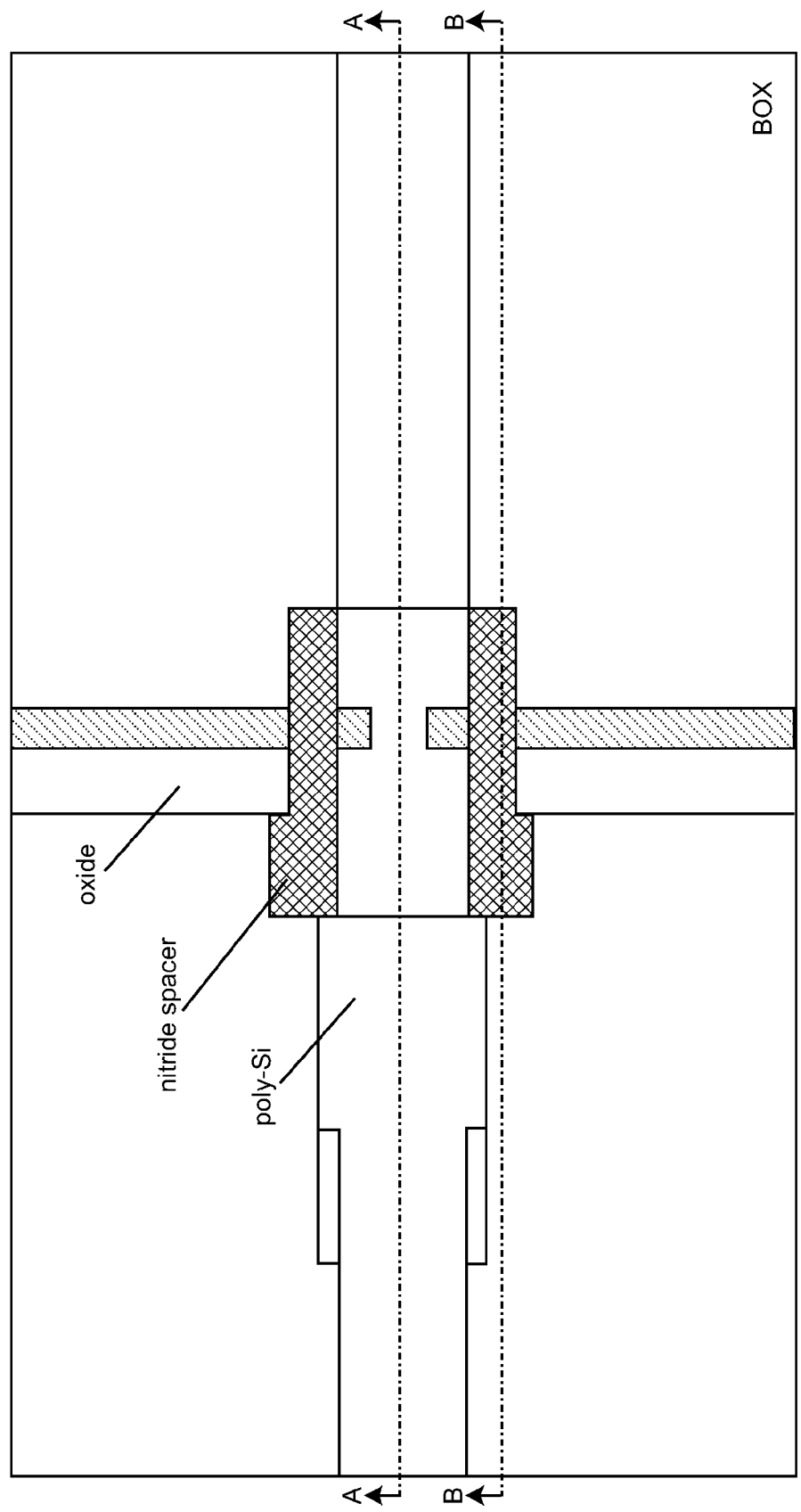
Figure 22B:
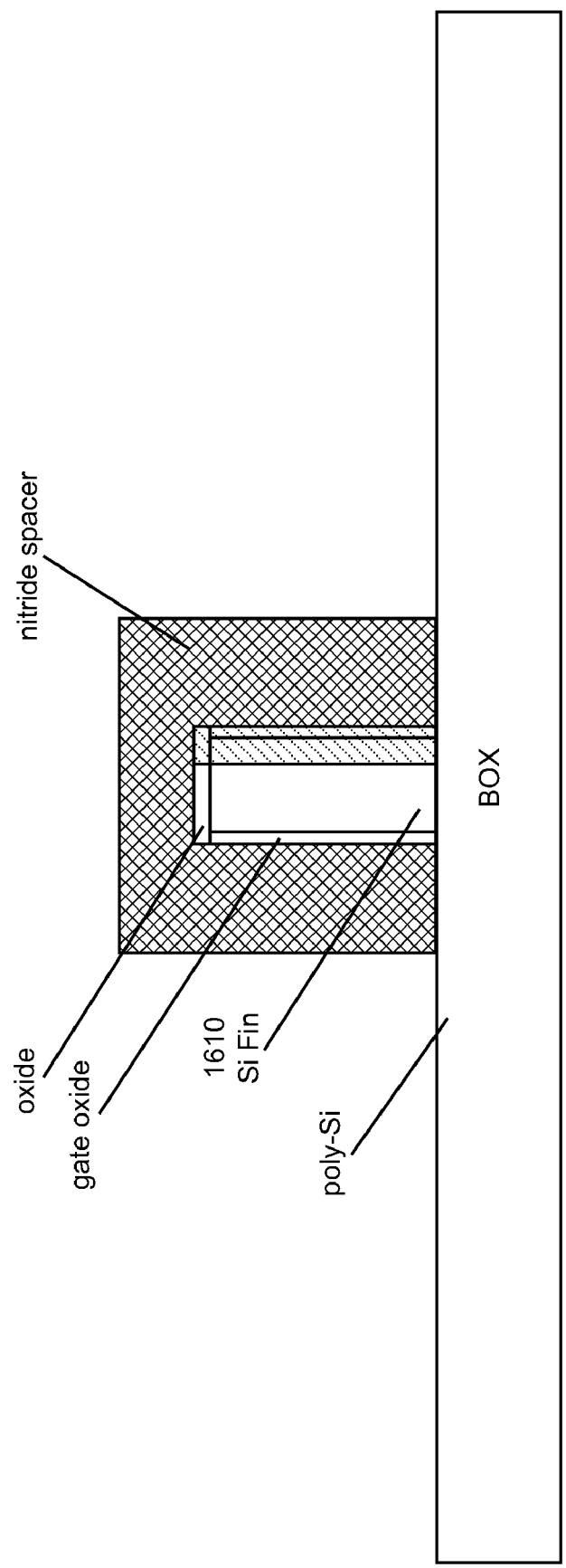
Figure 23A:
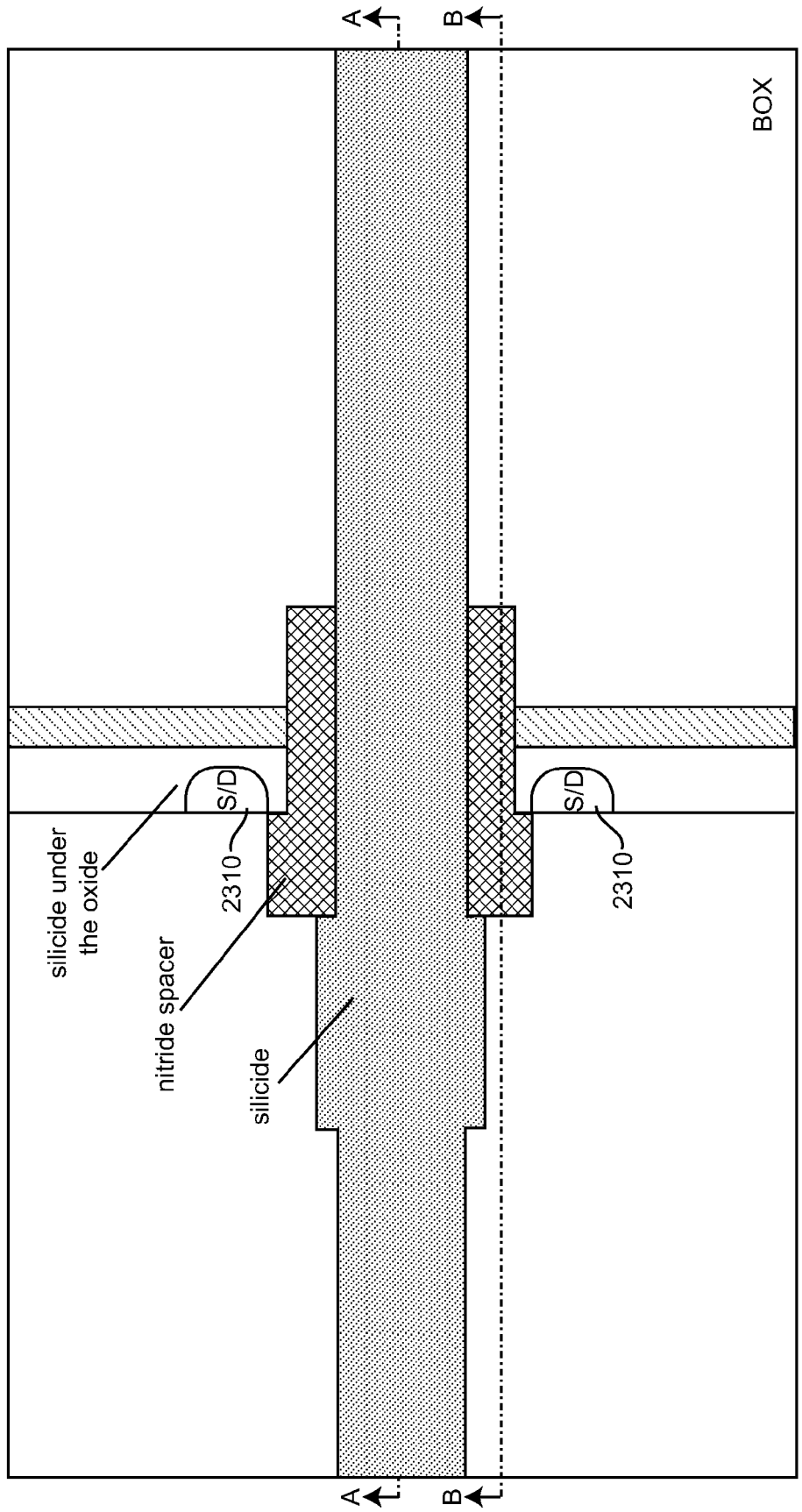
Figure 23B:
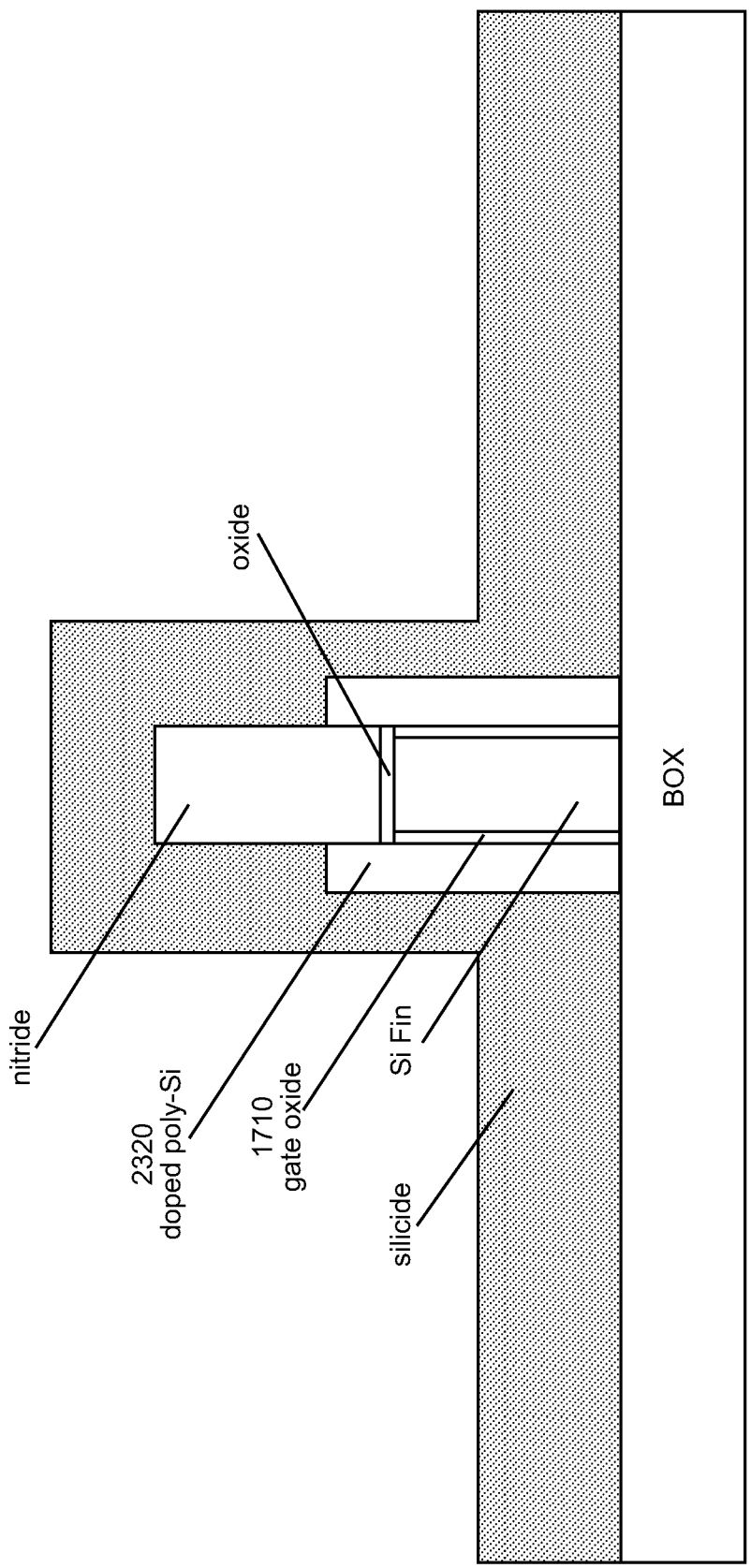
Figure 24:
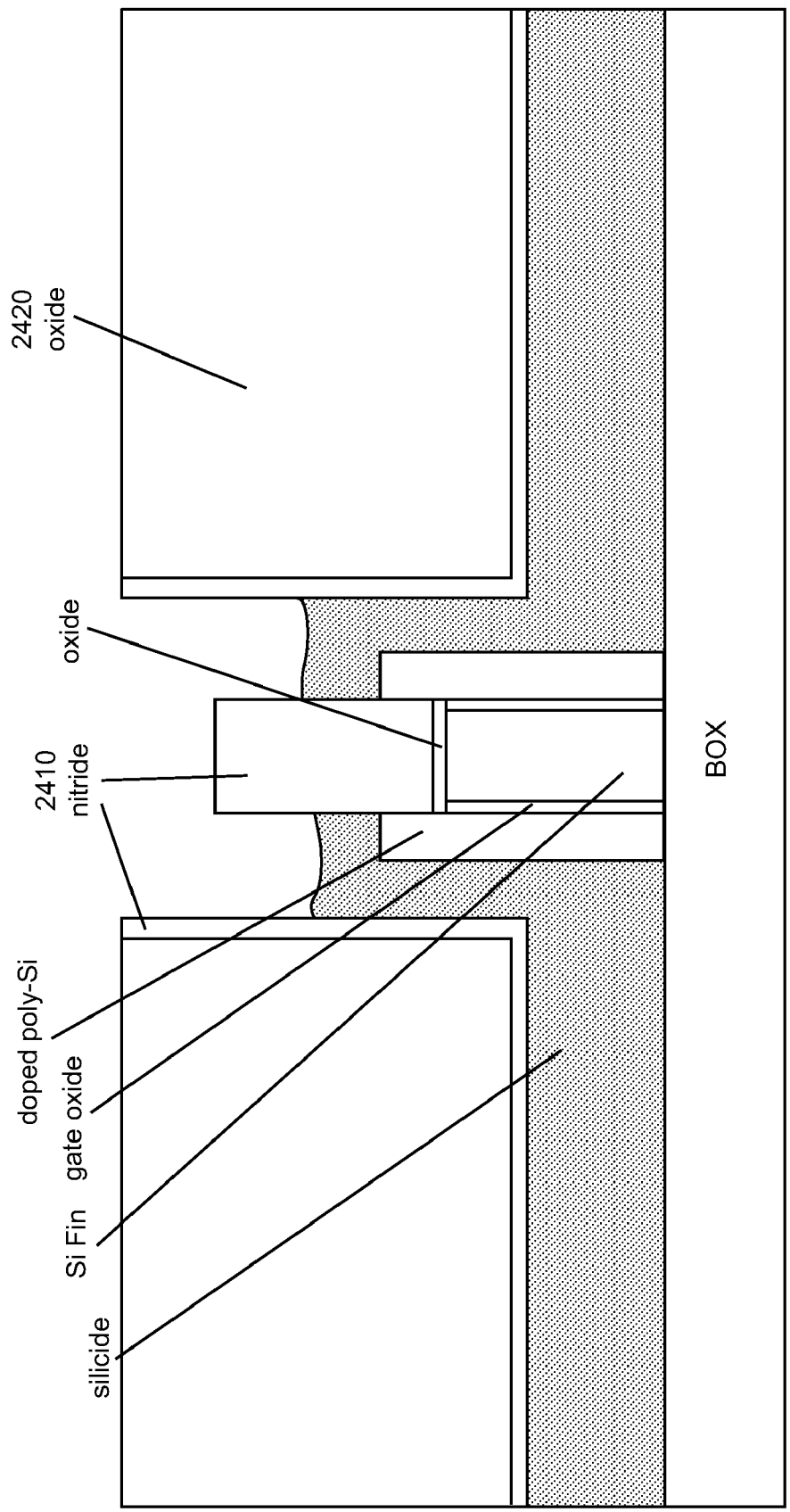

FIGS. 21A and 21B depict etching of exposed nitride selectively to oxide and poly-Si outside the gate region of the transistor. Then, an angled implant is performed to form an extension implant 2110 on the side (left side as illustrated in FIG. 21A) of the fin and a conventional process is used to deposit a nitride film (preferably about 20-40 nm thick) which is etched to form a spacer which wraps around the fin as shown in FIG. 22B along section B-B of FIG. 22A. It should be noted that this nitride is contiguous with the nitride 210 which remains under the poly-Si 1720 but above the fin 1610. Then, as shown in FIG. 23A, an angled implant is performed to form source/drain regions 2310 and the structure annealed to activate the dopants. It should be noted that this angled implant will provide an impurity profile which is asymmetrical but substantial symmetry of the impurity distribution, as illustrated, will result from the thermal annealing process. This implant process also provides doping 2320 in the poly-Si adjacent the gate oxide 1710 as shown in FIG. 23B. If desired, metal can be deposited before or after the annealing process to form low resistance silicide connections to the source/drain regions in a manner well-understood by those skilled in the art. Then, as shown in FIG. 24, a thin layer of nitride 2410 (to later serve as an etch stop) and a thick oxide layer 2420 are applied and planarized and etched back to the poly-Si/silicide which is then etched back to separate the gate contacts to complete the transistor in accordance with the second exemplary embodiment of the invention but for formation of vias and contacts to the gate and source/drain structures by conventional techniques.

In view of the foregoing, it is clearly seen that the invention provides a structure which can simultaneously provide significant reduction of capacitance in a finFET and reduction of short channel effects without compromising carrier mobility in a simple structure formed by a relatively simple, economical and highly repeatable process of high yield. It should be understood that capacitance reduction and short channel effect reduction are developed by processes which are decoupled and either or both can be independently tailored as device performance may require.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming a finFET comprising the steps of
    forming a conduction channel as a fin,
    forming a first gate structure and a second gate structure on opposite sides of said fin,
    performing an angled impurity implant as a halo implant asymmetrically in a portion of said conduction channel adjacent and controlled by said second gate structure such that said halo implant formed by said angled impurity implant also forms a super-steep retrograde well for a conduction channel portion adjacent and controlled by said first gate.

2. A method as recited in claim 1, wherein said step of forming gate structures includes deposition of different materials.

3. A method as recited in claim 2, wherein said different materials comprise Si and SiGe and including the further step of oxidizing said Si and SiGe at different rates to yield gate structures of different lengths.

4. A method as recited in claim 1, including the further step of disconnecting said first and second gate structures from each other.

5. A method as recited in claim 4, wherein said step of disconnecting said first and second gate structures from each other is performed by forming an oxide over the gate structures and etching that oxide above the channel.

6. A method as recited in claim 4, wherein said step of disconnecting said first and second gate structures from each other is performed by forming an oxide over the gate structures and polishing that oxide to said conduction channel.

7. A method as recited in claim 4, wherein said step of disconnecting said first and second gate structures from each other is performed by forming an oxide over the gate structures, etching that oxide to a spacer above said conduction channel and further etching that oxide.

8. A method as recited in claim 1, further including a step of forming a spacer around sides of said conduction channel adjacent said first and second gate structures.

9. A method as recited in claim 1, further including a step of performing angled source/drain implants in said conduction channel adjacent said first gate structure.

10. A method as recited in claim 1, including the further steps of
    depositing a metal on said conduction channel adjacent said first gate structure, and
    forming a silicide using metal deposited on said conduction channel.

* * * * *